United States Patent
Sakai et al.

(10) Patent No.: US 6,816,398 B2
(45) Date of Patent: Nov. 9, 2004

(54) MEMORY DEVICE

(75) Inventors: Takeshi Sakai, Ogaki (JP); Shigeharu Matsushita, Katano (JP); Yoshiyuki Ishizuka, Inazawa (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/308,064

(22) Filed: Dec. 3, 2002

(65) Prior Publication Data

US 2003/0103374 A1 Jun. 5, 2003

(30) Foreign Application Priority Data

Dec. 4, 2001 (JP) .......................................... 2001-369430
Nov. 14, 2002 (JP) .......................................... 2002-330172

(51) Int. Cl.$^7$ .............................................. G11C 11/22
(52) U.S. Cl. ........................................ 365/145; 365/149
(58) Field of Search ........................... 365/145, 149, 365/190

(56) References Cited

U.S. PATENT DOCUMENTS 5,357,460 A * 10/1994 Yusuki et al. ............... 365/145
5,668,754 A * 9/1997 Yamashita ................... 365/145
6,038,160 A * 3/2000 Nakane et al. ............... 365/145
6,229,730 B1 * 5/2001 Kato ........................... 365/145
6,654,273 B2 * 11/2003 Miwa et al. ................. 365/145
6,657,881 B1 * 12/2003 Rickes et al. ................ 365/145

OTHER PUBLICATIONS

Low–power High–speed LSI Circuits & Technology, Jan. 31, 1998, pp. 235–245.

* cited by examiner

Primary Examiner—Tan T. Nguyen
(74) Attorney, Agent, or Firm—Arent Fox, PLLC

(57) ABSTRACT

A memory device capable of improving the degree of integration and effectively preventing false data reading is obtained. This memory device comprises a pair of bit lines extending in a prescribed direction, a word line arranged to intersect with the pair of bit lines and a memory cell, arranged between the pair of bit lines and the word line, consisting of two capacitance elements. Thus, the area of the memory cell is reduced and no reference voltage is required.

22 Claims, 23 Drawing Sheets

FIG.4

|      | STANDBY | WRITING 0 | WRITING 1 | READING |
|------|---------|-----------|-----------|---------|
| WL2  | 1/2Vcc  | Vcc → 0V  | Vcc → 0V  | Vcc → 0V |
| WL3  | 1/2Vcc  | 1/2Vcc    | 1/2Vcc    | 1/2Vcc  |
| BL2T | 1/2Vcc  | Vcc       | 0V        | 0V → READ DATA |
| BL2B | 1/2Vcc  | 0V        | Vcc       | 0V → READ DATA |
| BL3T | 1/2Vcc  | 1/2Vcc    | 1/2Vcc    | 1/2Vcc  |
| BL3B | 1/2Vcc  | 1/2Vcc    | 1/2Vcc    | 1/2Vcc  |

MEMORY DEVICE

BACKGROUND OF THE INVENTION

1. Field of the Invention

The present invention relates to a memory device, and more specifically, it relates to a memory device storing data.

2. Description of the Background Art

A ferroelectric memory storing data through polarization of a ferroelectric substance is known in general. This ferroelectric memory is watched with interest as a high-speed nonvolatile memory requiring low power consumption. Therefore, the ferroelectric memory is actively researched and developed. A storage capacitance ferroelectric memory writing/reading data in a system similar to that of a DRAM (dynamic random access memory) employs one of two types of representative memory cells, i.e., a one-transistor two-capacitor (hereinafter referred to as 1T1C) memory cell and a two-transistor two-capacitor (hereinafter referred to as 2T2C) memory cell. The 2T2C memory cell is disclosed in "Low-power High-speed LSI Circuits & Technology", Jan. 31, 1998, pp. 235–245, for example.

FIG. 36 is a circuit diagram showing a memory cell part of a conventional 1T1C ferroelectric memory. FIG. 37 is a circuit diagram for illustrating a method of reading data in the conventional 1T1C ferroelectric memory including memory cells and reference cells.

As shown in FIG. 36, each memory cell 103 of the conventional 1T1C ferroelectric memory is formed by a selection transistor 101 and a ferroelectric capacitor 102, similarly to that of a DRAM. When the selection transistor 101 is turned on in a reading operation of the ferroelectric memory, the ferroelectric capacitor 102 is connected with a bit line capacitor Cbl. Then, a plate line PL is pulse-driven to transmit charges varying with the direction of polarization of the ferroelectric capacitor 102 to a bit line BLT. Thus, the ferroelectric memory reads data as the voltage of the bit line BLT, similarly to the DRAM. Whether the data is "1" or "0" depends on the direction of polarization of the ferroelectric capacitor 102. In this case, a reference cell is required for discharging charges in an intermediate quantity between those of charges discharged by the data "1" and "0" in data reading.

More specifically, reference cells 103a are connected to a pair of bit lines BLT and BLB respectively, as shown in FIG. 37. The data read operation is now described in detail with reference to FIG. 37. First, the pair of bit lines BLT and BLB are precharged to 0 V. When a word line WL1 selects a memory cell 103 connected with the bit line BLT, a word line RefWLB selects the reference cell 103a connected with the bit line BLB. When a word line WL2 selects a memory cell 103 connected with the bit line BLB, a word line RefWLT selects the reference cell 103a connected with the bit line BLT. Thereafter the plate line PL is pulse-driven so that charges corresponding to the memory cells 103 and the reference cells 103a are discharged to the pair of bit lines BLT and BLB. Thus, the pair of bit lines BLT and BLB obtain data signals of "1" or "0". A sense amplifier 105 amplifies the difference between the potentials of the signals. Thus, the ferroelectric memory reads data.

FIG. 38 is a circuit diagram showing a memory cell part of a conventional 2T2C ferroelectric memory. As shown in FIG. 38, two transistors and two capacitors are connected to a pair of bit lines BLT and BLB in the memory cell part of the 2T2C ferroelectric memory. The two transistors and the two capacitors store complementary data as 1-bit data. In this case, no reference cells are required for preparing reference voltages for reading the complementary data, dissimilarly to the aforementioned 1T1C ferroelectric memory.

In general, a matrix storage capacitance ferroelectric memory is also proposed. FIG. 39 is a circuit diagram showing memory cells 121 of a conventional matrix ferroelectric memory. As shown in FIG. 39, ferroelectric capacitors 122 are arranged on intersections between word lines WL1 to WL4 and bit lines BL1 to BL4 in the memory cells 121 of the conventional matrix ferroelectric memory. The matrix ferroelectric memory, reading voltages through capacitive coupling between the bit lines BL1 to BL4 and the ferroelectric capacitors 122, must ensure the capacitance similarly to the 1T1C ferroelectric memory. In the matrix ferroelectric memory, each memory cell 121 is formed by only a single ferroelectric capacitor 122, whereby the degree of integration can be more improved as compared with the 1T1C ferroelectric memory.

FIG. 40 is a schematic diagram for illustrating the operation principle of the matrix ferroelectric memory shown in FIG. 39. Operations of the conventional matrix ferroelectric memory are now described with reference to FIGS. 39 and 40.

First, each ferroelectric capacitor 122 has first and second ends connected to each word line WL and each bit line BL respectively. Both ends of the ferroelectric capacitor 122 are at the same potential in a standby state. In order to write data "1", voltages of Vcc and 0 V are applied to the word line WL and the bit line BL respectively. At this time, the voltage Vcc is applied to the ferroelectric capacitor 122. Thus, the ferroelectric capacitor 122 shifts to a point A in FIG. 40 despite an initial state. When both ends of the ferroelectric capacitor 122 are thereafter set to the same potential, the ferroelectric capacitor 122 makes transition to "1" in FIG. 40. In order to write data "0", voltages of 0 V and Vcc are applied to the word line WL and the bit line BL respectively. At this time, a voltage −Vcc is applied to the ferroelectric capacitor 122. Thus, the ferroelectric capacitor 122 shifts to a point B in FIG. 40. When both ends of the ferroelectric capacitor 122 are thereafter set to the same potential, the ferroelectric capacitor 122 makes transition to "0" in FIG. 40.

In a read operation, the bit line BL is precharged to 0 V. Then, the word line WL is set to the voltage Vcc. Assuming that Ccell represents the capacitance of the ferroelectric capacitor 122 of each memory cell, Cref represents the capacitance of a ferroelectric capacitor 122a of each reference cell 121a (see FIG. 39), Cbl represents the parasitic capacitance of a bit line BLn and Cblref represents the parasitic capacitance of a reference bit line Blref, the voltage Vcc of the word line WL is capacitively divided by the capacitances Ccell and Cbl as to the bit line BLn, and capacitively divided by the parasitic capacitances Cref and Cblref as to the reference bit line Blref. The capacitance Ccell can be approximated as a capacitance C0 or C1 depending on held data. Therefore, a potential V0 of the bit line BLn holding data "0", a potential V1 of the bit line BLn holding the data "1" and a potential Vref of the reference bit line Blref are expressed as follows respectively:

$$V0 = \{C0/(C0+Cbl)\} \times Vcc \quad (1)$$

$$V1 = \{C1/(C1+Cbl)\} \times Vcc \quad (2)$$

$$Vref = \{(Cref/(Cref+Cblref)) \times Vcc \quad (3)$$

The potential Vref of the reference bit line Blref is set to an intermediate level between the potential V0 of the bit line BLn holding the data "0" and the potential V1 of the bit line BLn holding the data "1".

A sense amplifier determines the difference between the potential V0 or V1 and the potential Vref thereby performing reading. At this time, data of the memory cell is destroyed and hence a write operation (restoration) responsive to the read data is performed after the reading.

The conventional 1T1C ferroelectric memory shown in FIG. 36 having the memory cells each formed by only a single transistor and a single capacitor advantageously has a high degree of integration. However, a reference voltage disadvantageously deviates from a design value due to fabrication dispersion of the ferroelectric capacitor 102 of change of the quantity of polarization charges in the write and read operations or resulting from time change. This disadvantageously leads to false data reading.

In the conventional 2T2C ferroelectric memory shown in FIG. 38, each memory cell is formed by two ferroelectric capacitors and two selection transistors, and hence the degree of integration is inferior to that of the 1T1C ferroelectric memory.

In the conventional matrix ferroelectric memory shown in FIG. 39, false data reading disadvantageously results from fabrication dispersion or fluctuation of a reference voltage caused by change of the quantity of polarization charges. Further, the matrix ferroelectric memory disadvantageously causes a disturbance phenomenon of a non-selected cell in the write and read operations. In the matrix ferroelectric memory, a voltage of ½ Vcc is regularly applied to a non-selected bit line BL and a non-selected word line WL and hence the voltage of ½ Vcc is applied to the non-selected cell at the maximum. As shown in FIG. 41, therefore, disturbance is repeated due to hysteretic characteristics of a ferroelectric substance to reduce the quantity of polarization charges. When the quantity of polarization charges is reduced, that of each reference cell 122a is also reduced, to result in remarkable fluctuation of the aforementioned reference voltage. This disadvantageously further prompts false data reading.

SUMMARY OF THE INVENTION

An object of the present invention is to provide a memory device capable of improving the degree of integration and effectively preventing false reading.

Another object of the present invention is to effectively prevent a non-selected memory cell from a disturbance phenomenon in the aforementioned memory device.

A memory device according to an aspect of the present invention comprises a pair of bit lines extending in a prescribed direction, a word line arranged to intersect with the pair of bit lines and a memory cell, arranged between the pair of bit lines and the word line, consisting of two capacitance means.

The memory device according to this aspect is provided with the memory cell consisting of two capacitance means as described above, whereby the area of the memory cell can be reduced as compared with a conventional memory cell consisting of two capacitance means and two transistors and hence the degree of integration can be improved. When complementary data are written in the two capacitance means respectively, no reference voltage is required and initial potential difference in reading can be increased as compared with a case of employing the reference voltage. Thus, false data reading can be effectively prevented also when the characteristics of the capacitance means are deteriorated due to fabrication dispersion or increase of the number of write/read times.

In the memory device according to the aforementioned aspect, the capacitance means preferably include a ferroelectric layer. According to this structure, the ferroelectric memory can be formed in a high degree of integration to be capable of effectively preventing false data reading.

In the memory device according to the aforementioned aspect, the two capacitance means preferably store complementary data respectively, thereby storing one-bit data in the memory cell. According to this structure, no reference voltage is required and initial potential difference in reading can be increased.

In this case, the memory device preferably applies a pulsing voltage to a selected word line while applying complementary voltages to a selected pair of bit lines when writing the data. According to this structure, the memory device can write first data in a first bit line in a high-level voltage period of a pulse while writing second data in a second bit line in a low-level voltage period of the pulse. Consequently, the memory device can write complementary data in the pair of bit lines in a cycle of one pulse.

The memory device applying the aforementioned pulsing voltage preferably further comprises a pulse voltage application circuit for applying the pulsing voltage to the selected word line at least when writing the data. According to this structure, the memory device can easily apply the pulsing voltage to the selected word line.

The memory device applying the aforementioned pulsing voltage preferably further comprises a write voltage application circuit for applying the complementary voltages to the selected pair of bit lines when writing the data. According to this structure, the memory device can easily apply the complementary voltages to the selected pair of bit lines.

The memory device applying the aforementioned pulsing voltage may apply a prescribed voltage to a selected memory cell while applying a voltage substantially half the prescribed voltage to a non-selected memory cell when writing and reading data.

The memory device applying the aforementioned pulsing voltage reads the data by detecting difference between the potentials of the pair of bit lines corresponding to the complementary data stored in the two capacitance means respectively. According to this structure, the memory device can easily read the data.

In this case, the memory device preferably detects the difference between the potentials of the pair of bit lines corresponding to the complementary data stored in the two capacitance means respectively by precharging the pair of bit lines connected with the selected memory cell to a prescribed voltage and thereafter applying the pulsing voltage to the word line connected with the selected memory cell when reading the data. According to this structure, the memory device can easily detect the difference between the potentials of the pair of bit lines in a high-voltage period of the pulsing voltage.

In this case, the memory device preferably further comprises a read amplifier for amplifying the difference between the potentials of the pair of bit lines corresponding to the complementary data stored in the two capacitance means respectively. According to this structure, the memory device can easily read the data.

The memory device according to the aforementioned aspect preferably applies a prescribed voltage to a selected memory cell while applying a voltage of substantially one third of the prescribed voltage to a non-selected memory cell when writing and reading data. According to this structure, the non-selected memory cell can be effectively prevented from a disturbance phenomenon.

In this case, the memory device may apply the prescribed voltage to a selected memory cell connected with the first one of the pair of bit lines while applying the voltage of substantially one third of the prescribed voltage to the non-selected memory cell and a selected memory cell connected with the second one of the pair of bit lines thereby writing prescribed data in the selected memory cell connected with the first one of the pair of bit lines and thereafter applying the prescribed voltage to the selected memory cell connected with the second one of the pair of bit lines while applying the voltage of substantially one third of the prescribed voltage to the non-selected memory cell and the selected memory cell connected with the first one of the pair of bit lines thereby writing data inverse to the prescribed data in the selected memory cell connected with the second one of the pair of bit lines when writing the data. According to this structure, the memory device can write the data while reducing the voltage applied to the non-selected cell to substantially one third of the prescribed voltage.

In this case, the memory device detects the difference between the potentials of the pair of bit lines corresponding to the complementary data stored in the two capacitance means respectively by precharging the pair of bit lines connected with the selected memory cell to a prescribed first voltage and thereafter applying a prescribed second voltage to the word line connected with the selected memory cell when reading the data. According to this structure, the memory device can read the data while reducing the voltage applied to the non-selected cell to substantially one third of the prescribed voltage.

The memory device according to the aforementioned aspect is preferably capable of applying a pulse having a prescribed pulse width causing polarization inversion when a high voltage is applied to the capacitance means while causing substantially no polarization inversion when a low voltage is applied to the capacitance means to the memory cell, for applying a pulse of a high voltage having the prescribed pulse width to a selected memory cell while applying a pulse of a low voltage having the prescribed pulse width to a non-selected memory cell at least either in data writing or in data reading. According to this structure, the memory device can write or read data in or from the selected memory cell while causing substantially no polarization inversion in the non-selected memory cell by applying a pulse of a high voltage having the aforementioned prescribed pulse width to the selected memory cell and applying a pulse of a low voltage having the aforementioned prescribed pulse width to the non-selected memory cell at least either in data writing or in data reading. Consequently, the non-selected memory cell can be prevented from disturbance. In this case, the prescribed pulse width is preferably not more than 70 ns.

In the memory device according to the aforementioned aspect, at least either the bit lines forming the pair of bit lines or the word line has a multilevel structure, and the capacitance means preferably have multilevel structures. When the capacitance means formed between the bit lines and the word line have multilevel structures, the degree of integration can be improved as compared with a case of employing capacitance means having single-level structures.

In the memory device including the aforementioned capacitance means having multilevel structures, the two capacitance means forming each memory cell may include a first data storage part and a second data storage part storing complementary data respectively, and the first data storage part and the second data storage part may be transversely arranged at a prescribed interval. According to this structure, the memory cell including the first and second data storage parts can be vertically stacked, whereby the degree of integration can be improved.

In the memory device including the aforementioned capacitance means having multilevel structures, the two capacitance means forming each memory cell may include a first data storage part and a second data storage part storing complementary data respectively, and the first data storage part and the second data storage part may be vertically arranged at a prescribed interval. According to this structure, the first and second data storage parts forming the memory cell can be vertically stacked, whereby the degree of integration can be improved.

In the memory device including the aforementioned capacitance means having multilevel structures, the two capacitance means forming each memory cell may include a first data storage part and a second data storage part storing complementary data respectively, and the first data storage part and the second data storage part may be obliquely arranged at a prescribed interval. According to this structure, the first and second data storage parts forming the memory cell can be obliquely stacked, whereby the degree of integration can be improved.

In the memory device including the aforementioned capacitance means having multilevel structures, the bit lines forming the pair of bit lines are preferably arranged above and under the word line respectively, and the capacitance means preferably include a first data storage layer arranged between the bit line located above the word line and the word line and a second data storage layer arranged between the bit line located under the word line and the word line. According to this structure, the capacitance means (data storage layers) can have two-level structures, whereby the degree of integration can be improved as compared with a case of employing capacitance means of single-level structures.

In the memory device including the capacitance means having the aforementioned multilevel structures, the bit lines forming the pair of bit lines preferably include at least first- and second-level bit lines, the word line preferably includes at least first- and second-level word lines, and the capacitance means preferably include a first data storage layer arranged between the first-level bit line and the first-level word line and a second data storage layer arranged between the second-level bit line and the second-level word line, while the memory device preferably further comprises an insulator layer formed between a first region formed with the first data storage layer, the first-level word line and the first-level bit line and a second region formed with the second data storage layer, the second-level word line and the second-level bit line for isolating the first region and the second region from each other. According to this structure, ferroelectric capacitors vertically adjacent to each other can be isolated from each other.

In the memory device including the capacitance means having the aforementioned multilevel structures, the bit lines forming the pair of bit lines preferably include at least first-, second- and third-level bit lines, the word line preferably includes at least first- and second-level word lines, and the capacitance means preferably include a first data storage layer arranged between the first-level bit line and the first-level word line, a second data storage layer arranged between the first-level word line and the second-level bit line, a third data storage layer arranged between the second-level bit line and the second-level word line and a fourth data storage layer arranged between the second-level word line and the third-level bit line. According to this structure, memory cells vertically adjacent to each other can share the second-level bit line, whereby the number of interconnection layers (bit lines and word lines) can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 illustrates voltages of the respective parts in respective operations of the ferroelectric memory according to the first embodiment shown in FIG. 1;

DESCRIPTION OF THE PREFERRED EMBODIMENTS

Embodiments of the present invention are now described with reference to the drawings.

(First Embodiment)

Figure 1:
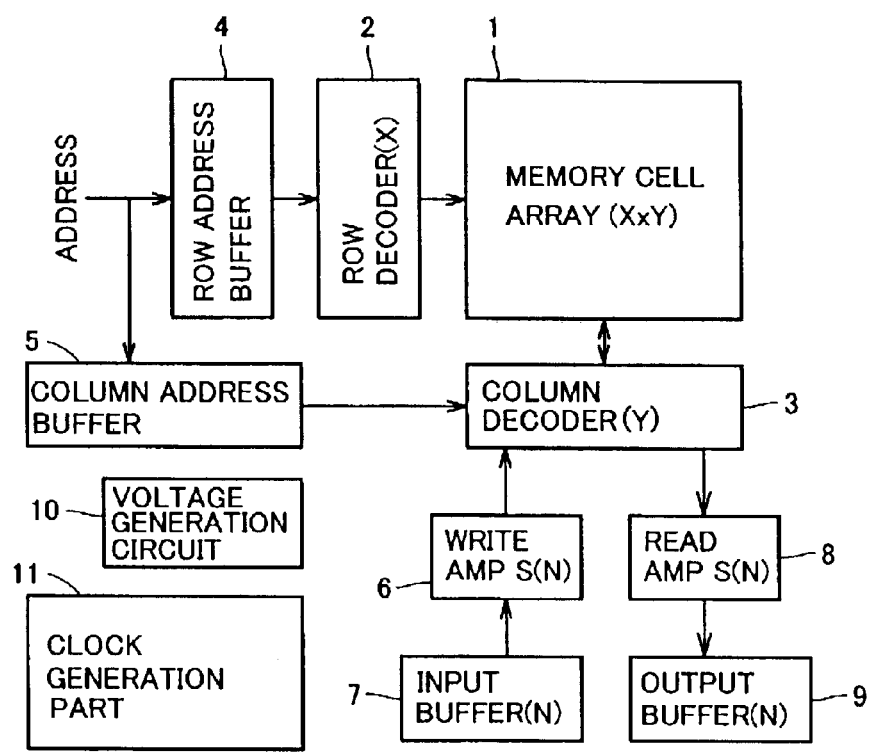
FIG. 1 is a block diagram showing the overall structure of a ferroelectric memory according to a first embodiment of the present invention.

The overall structure of a ferroelectric memory according to a first embodiment of the present invention is described with reference to FIGS. 1 and 2. The ferroelectric memory according to the first embodiment includes a memory cell array 1, a row decoder 2, a column decoder 3, a row address buffer 4, a column address buffer 5, a write amplifier 6, an input buffer 7, a read amplifier 8, an output buffer 9, a voltage generation circuit 10 and a clock generation part 11.

Figure 2:
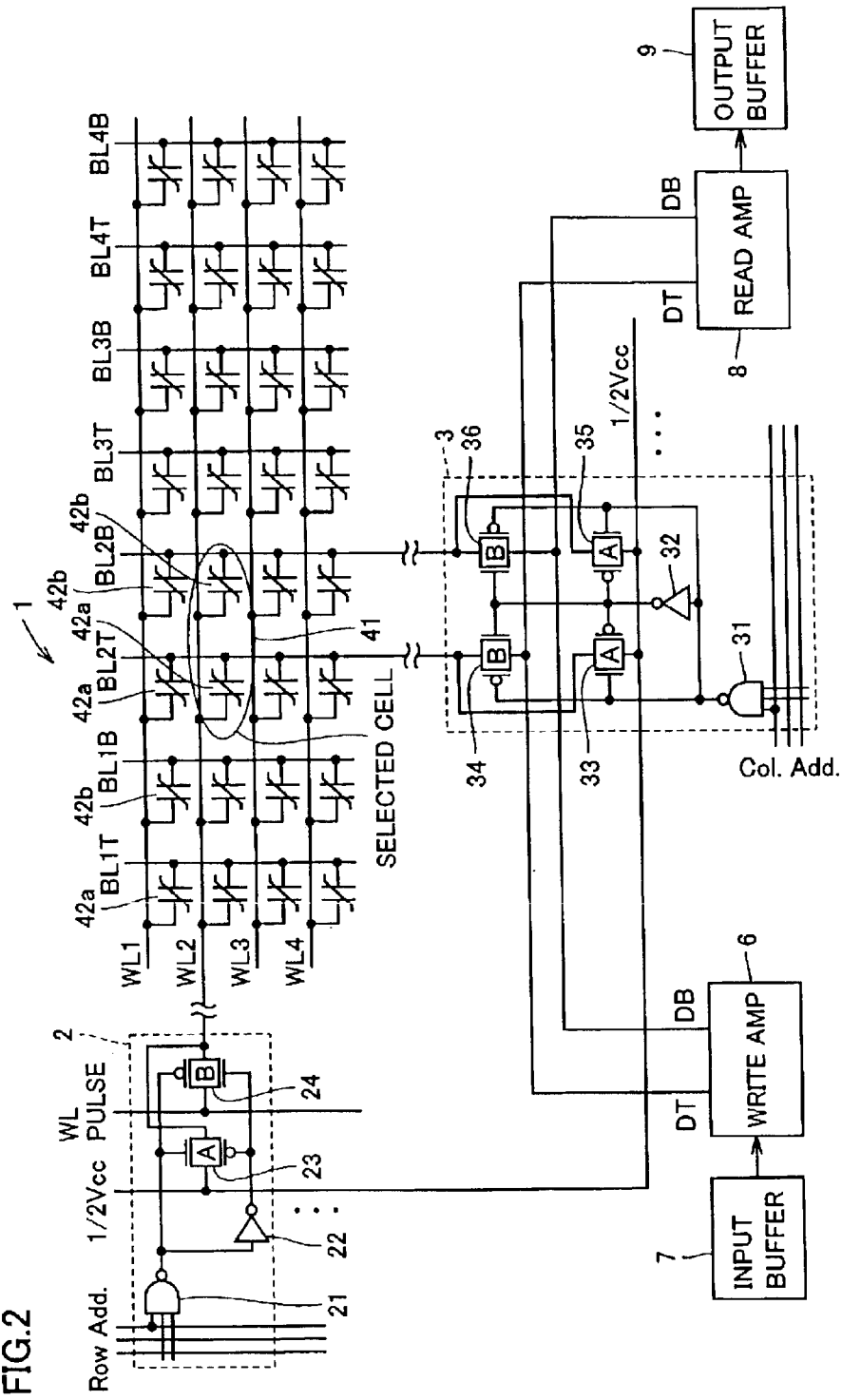
FIG. 2 is an equivalent circuit diagram showing the structure of a portion around a memory cell array of the ferroelectric memory according to the first embodiment shown in FIG. 1.
Figure 3:
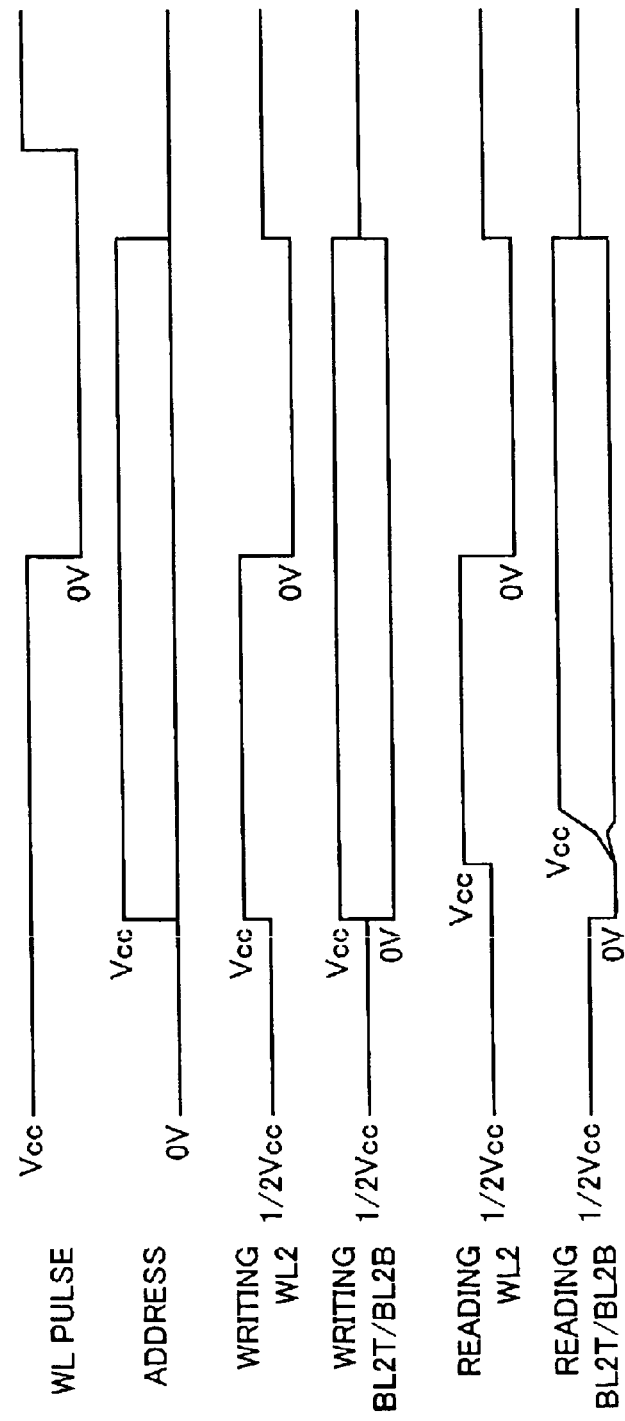
FIG. 3 shows voltage waveforms of respective parts in the ferroelectric memory according to the first embodiment shown in FIG. 1.

As shown in FIG. 2, the memory cell array 1 includes a plurality of memory cells 41 each consisting of only two ferroelectric capacitors 42a and 42b. The ferroelectric capacitors 42a and 42b are examples of the "capacitance means" in the present invention. The row decoder 2 is connected to word lines WL1 to WL4, and the column decoder 3 is connected to bit lines BL1T and BL1B to BL4T and BL4B. The read amplifier 8 is connected to the write amplifier 6 through the column decoder 3. The input buffer 7 is connected to the write amplifier 6, and the output buffer 9 is connected to the read amplifier 8.

The row decider 2 includes a NAND circuit 21, an inverter circuit 22 and transfer gates 23 and 24. A pulse line WL PULSE is connected to the transfer gate 24. The transfer gate 24 and the pulse line WL PULSE form a "pulse application circuit". The column decoder 3 includes a NAND circuit 31, an inverter circuit 32 and transfer gates 33, 34, 35 and 36.

Operations of the aforementioned ferroelectric memory according to the first embodiment are now described with reference to FIGS. 1 to 4. It is assumed that a memory cell 41 arranged on the intersections between the word line WL2 and the bit lines BL2T and BL2B is selected. In a standby time, the row decoder 2 and the column decoder 3 apply a voltage of ½ Vcc to all word lines WL1 to WL4 and all bit lines BL1T and BL1B to BL4T and BL4B. In other words, both of row address lines (Row Add.) and column address lines (Col. Add) are low (0 V), while outputs of the NAND circuits 21 and 31 are high (Vcc). Thus, the transfer gates 23, 33 and 35 enter open states for supplying the voltage of ½ Vcc to the word line WL2 and the bit lines BL2T and BL2B.

In order to write data "0", the ferroelectric memory applies a pulse WL PULSE to the word line WL2 selected by the row decoder 2 through the transfer gate 24. The write amplifier 6 applies voltages Vcc and 0 V to the pair of bit lines BL2T and BL2B selected by the column decoder 3 through the transfer gates 34 and 36 respectively. The write amplifier 6 is an example of the "write voltage application circuit" in the present invention. Thus, the ferroelectric memory writes data "1" in the ferroelectric capacitor 42b connected with the bit line BL2B while the word line WL2 is at the voltage Vcc, and writes the data "0" in the ferroelectric capacitor 42a connected with the bit line BL2T while the word line WL2 is at the voltage 0 V. Thus, the ferroelectric memory writes complementary data in the two ferroelectric capacitors 42a and 42b. In this case, it follows that the data "0" is written as the data of the memory cell 41. Thereafter the ferroelectric memory resets the row address lines (Row Add.) and the column address lines (Col. Add.) to 0 V, thereby returning the voltages of the word line WL2 and the bit lines BL2T and BL2B to the standby level of ½ Vcc and terminating the write operation.

In order to write the data "1", the ferroelectric memory inverts data input in the write amplifier 6 from the input buffer 7 from that in the aforementioned write operation for the data "0". More specifically, the ferroelectric memory applies the voltages 0 V and Vcc to the bit lines BL2T and BL2B respectively. Therefore, the data "1" is written as cell data.

In the read operation, the read amplifier 8 precharges the pair of bit lines BL2T and BL2B connected with the memory cell 41, selected by the column decoder 3, to 0 V. Thereafter the ferroelectric memory applies the pulse WL PULSE to the word line WL2 selected by the row decoder 2 through the transfer gate 24, similarly to the write operation. In this case, however, the ferroelectric memory delays selection of the word line WL2 by the row decoder 2 by delaying settlement of a row address or the like, in order drive the word line WL after precharging the pair of bit lines BL2T and BL2B to 0 V. The pulse WL PULSE is initially at the potential Vcc, and hence potential difference substantially corresponding to the voltage Vcc is developed between both poles of the two ferroelectric capacitors 42a and 42b of the selected cell 41. Complementary data are written in the two ferroelectric capacitors 42a and 42b, whereby different voltages appear on the pair of bit lines BL2T and BL2B. The difference between the voltages is amplified by the read amplifier 8 and output through the output buffer 9. The pair of bit lines BL2T and BL2B may alternatively be precharged to a voltage level other than 0 V.

The aforementioned read operation is destructively performed, and hence the data settled by the read amplifier 8 must be rewritten (restored) in the selected cell 41. This rewrite operation is carried out similarly to the aforementioned data write operation. In other words, the ferroelectric memory rewrites the data "1" in the ferroelectric capacitor 42a or 42b connected with the bit line BL2T or BL2B at the voltage 0 V in the first half period when the word line WL2 is at the voltage Vcc and rewrites the data "0" in the ferroelectric capacitor 42a or 42b connected with the bit line BL2T or BL2B at the voltage Vcc in the second half period when the word line WL2 is at the voltage 0 V.

Thereafter the ferroelectric memory resets the row address lines (Row Add.) and the column address lines (Col. Add.) to 0 V, thereby returning the voltages of the word line WL2 and the bit lines BL2T and BL2B to the standby level of ½ Vcc. Thus, the ferroelectric memory terminates the read operation.

Figure 41:
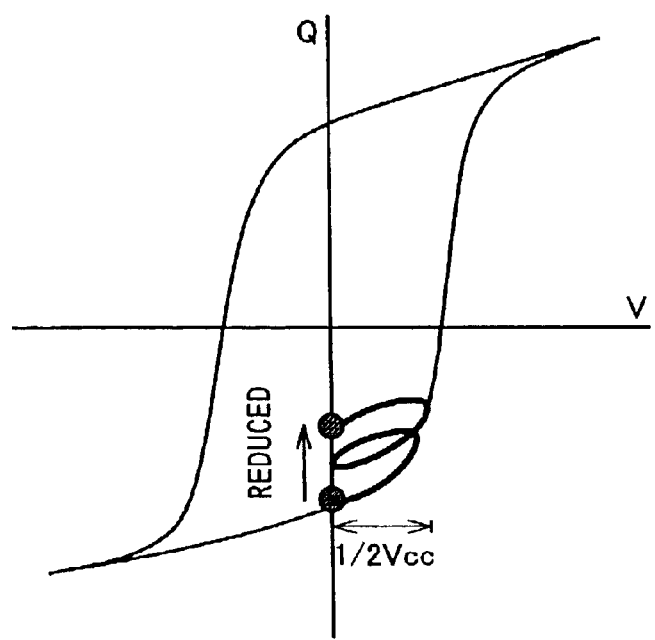
FIG. 41 is a hysteretic diagram for illustrating a disturbance phenomenon in the conventional matrix ferroelectric memory.

The voltage of ½ Vcc is regularly applied to the non-selected bit lines BL1T and BL1B, BL3T and BL3B and BL4T and BL4B and the non-selected word lines WL1, WL3 and WL4 in the write operation and the read operation, and hence it follows that a voltage of ½ Vcc at the maximum is applied to the ferroelectric capacitors 42a and 42b of the non-selected cells 41. Similarly to the conventional ferroelectric memory shown in FIG. 41, therefore, disturbance is repeated due to the hysteresis of a ferroelectric substance to reduce the quantity of polarization charges. Basically, however, no polarization inversion is caused with this potential difference and hence no problem arises if the reduction of the quantity of polarization charges is small. In other words, the ferroelectric memory according to the first embodiment detects the difference between the potentials of the complementary data without employing a reference voltage, whereby the ferroelectric memory is hardly influenced by reduction of the quantity of polarization charges as compared with the case of employing the reference voltage.

According to the first embodiment, each memory cell 41 is formed only by the two ferroelectric capacitors 42a and 42b as hereinabove described, whereby the memory cell area can be reduced as compared with that in a 2T2C ferroelectric memory having memory cells each formed by two selection transistors and two ferroelectric capacitors and hence the degree of integration can be improved. The two ferroelectric capacitors 42a and 42b forming each memory cell 41 store complementary data respectively, whereby no reference voltage is required and initial potential difference in reading can be increased. Thus, even if the characteristics of the ferroelectric capacitors 42a and 42b are deteriorated due to fabrication dispersion or increase of the number of write/read times, the ferroelectric memory can be effectively prevented from false data reading.

(Second Embodiment)

FIGS. 5 to 8 show a ferroelectric memory according to a second embodiment of the present invention. Referring to FIGS. 5 to 8, the ferroelectric memory according to the second embodiment applies a voltage of ⅓ Vcc at the maximum to ferroelectric capacitors 42a and 42b of non-selected cells 41, dissimilarly to the aforementioned first embodiment. When a problem of disturbance arises due to application of a voltage of ½ Vcc, the maximum voltage applied to the ferroelectric capacitors 42a and 42b of the non-selected cells 41 can be reduced to ⅓ Vcc by employing voltages of ⅓ Vcc and ⅔ Vcc. The remaining structure of the ferroelectric memory according to the second embodiment is similar to that of the ferroelectric memory according to the first embodiment.

Operations of the ferroelectric memory according to the second embodiment are now described. In a standby state, the ferroelectric memory sets all word lines WL1 to WL4 and all bit lines BL1T and BL1B to BL4T and BL4B to the voltage of ½ Vcc. It is assumed that the memory cell 41 arranged on the intersections between the word line WL2 and the pair of bit lines BL2T and BL2B is selected.

Figure 5:
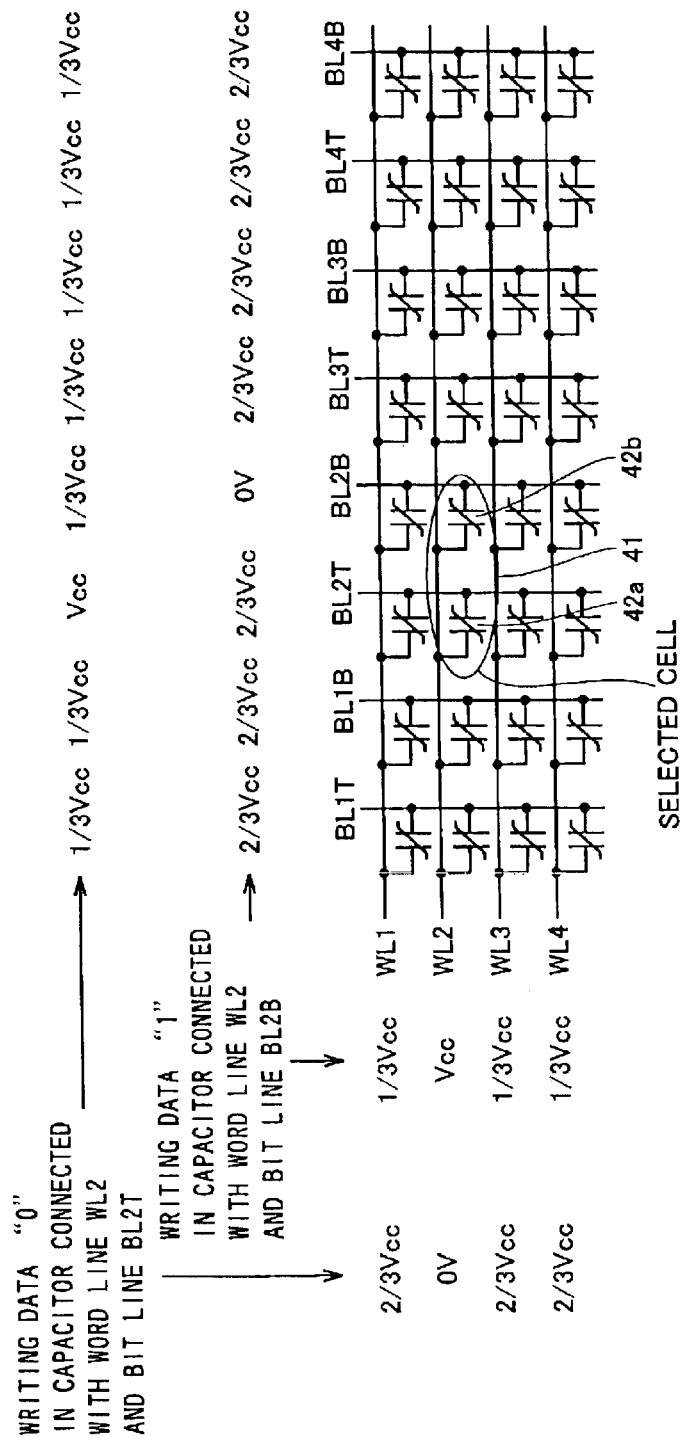
FIG. 5 is a schematic diagram for illustrating voltages applied to word lines WL and pairs of bit lines BLT and BLB when writing data "0" in a ferroelectric memory according to a second embodiment of the present invention.

FIG. 5 shows voltages applied to the word lines WL1 to WL4 and the pairs of bit lines BL1T and BL1B to BL4T and BL4B for writing data "0". According to the second embodiment, the disturbance voltage is set to ⅓ Vcc at the maximum and hence data cannot be simultaneously written in the ferroelectric capacitors 42a and 42b connected with the bit lines BL2T and BL2B respectively. Therefore, the write operation must be performed twice while varying the voltages applied to the word lines WL1 to WL4 and the bit lines BL1T and BL1B to BL4T and BL4B, as shown in FIG. 5.

The data may be first written in either the ferroelectric capacitor 42a or 42b connected with the bit line BL2T or BL2B.

As shown in FIG. 5, the ferroelectric memory writes the data "0" in the ferroelectric capacitor 42a connected with the bit line BL2T while setting the word line WL2 and the bit line BL2T to the voltages 0 V and Vcc respectively. Further, the ferroelectric memory writes inverse data "1" in the ferroelectric capacitor 42b connected with the bit line BL2B while setting the word line WL and the bit line BL2B to the voltages Vcc and 0 V respectively. At this time, the voltages applied to the word lines WL1 to WL4 and the bit lines BL1T and BL1B to BL4T and BL4B are set as shown in FIG. 5 so that voltages applied to the non-written ferroelectric capacitor 42a or 42b of the selected cell 41 and all ferroelectric capacitors 42a and 42b of the non-selected cells 41 can be reduced to ⅓ Vcc. Thereafter the ferroelectric memory returns all word lines WL1 to WL4 and all pairs of bit lines BL1T and BL1B to BL4T and BL4B to standby states of ½ Vcc, thereby terminating the write operation.

Figure 6:
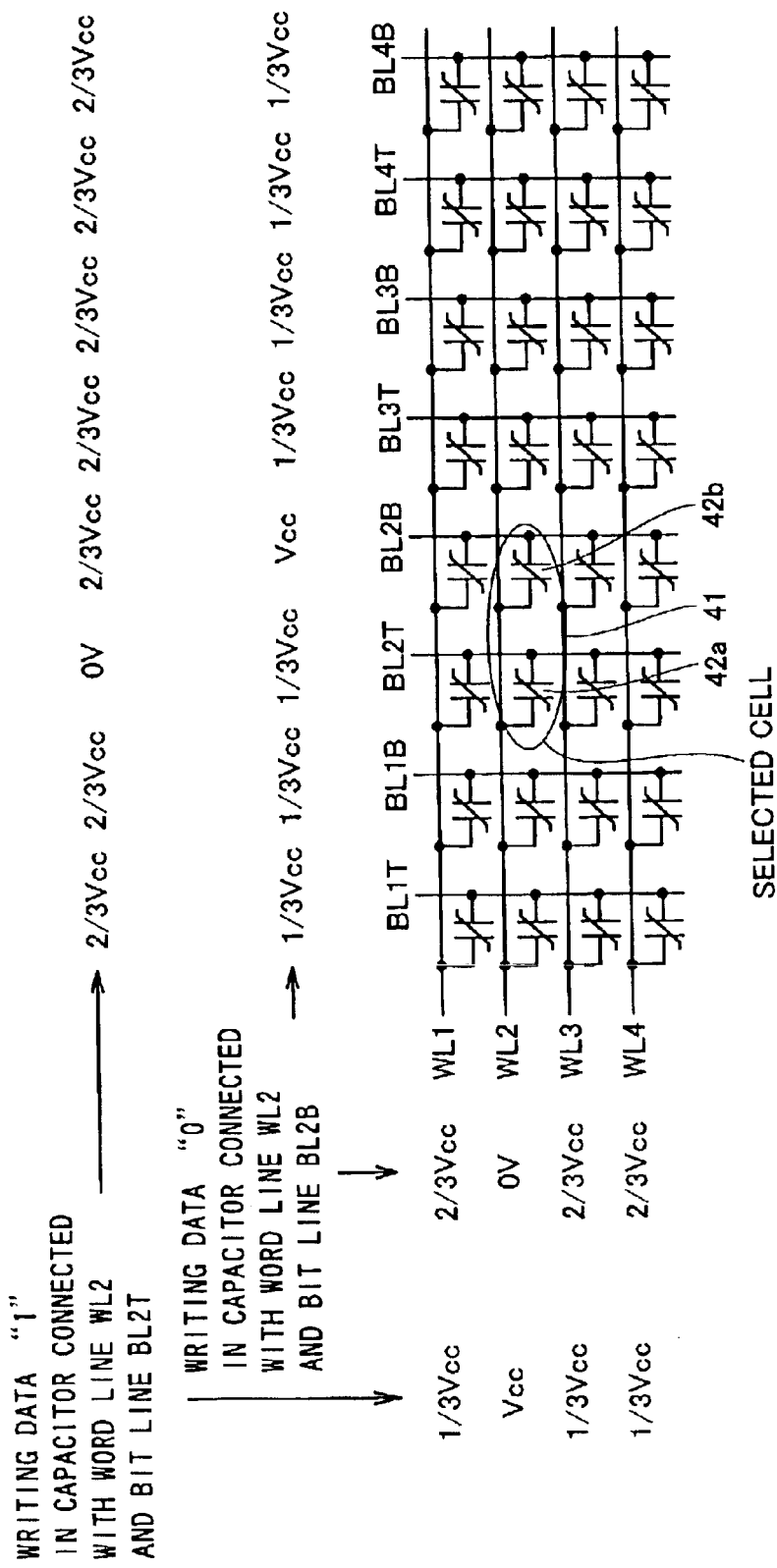
FIG. 6 is a schematic diagram for illustrating voltages applied to the word lines WL and the pairs of bit lines BLT and BLB when writing data "1" in the ferroelectric memory according to the second embodiment of the present invention.

FIG. 6 shows voltages applied to the word lines WL1 to WL4 and the bit lines BL1T and BL1B to BL4T and BL4B for writing the data "1". In this case, data inverse to those in the aforementioned case of writing the data "0" are written in the ferroelectric capacitors 42a and 42b connected with the bit lines BL2T and BL2B respectively. In correspondence thereto, the voltages applied to the word lines WL1 to WL4 and the bit lines BL1T and BL1B to BL4T and BL4B are set as shown in FIG. 6 so that voltages applied to the non-written ferroelectric capacitor 42a or 42b of the selected cell 41 and all ferroelectric capacitors 42a and 42b of the non-selected cells 41 can be reduced to ⅓ Vcc.

Figure 7:
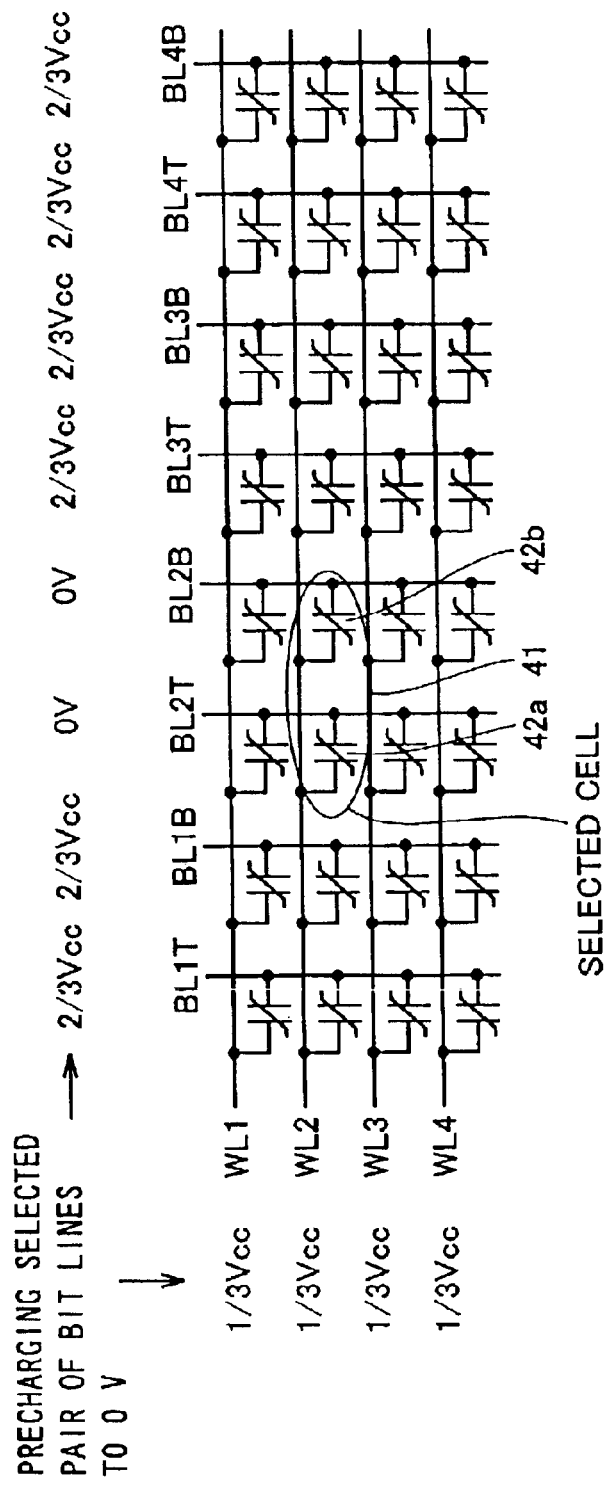
FIGS. 7 and 8 are schematic diagrams for illustrating a read operation of the ferroelectric memory according to the second embodiment of the present invention.
Figure 8:
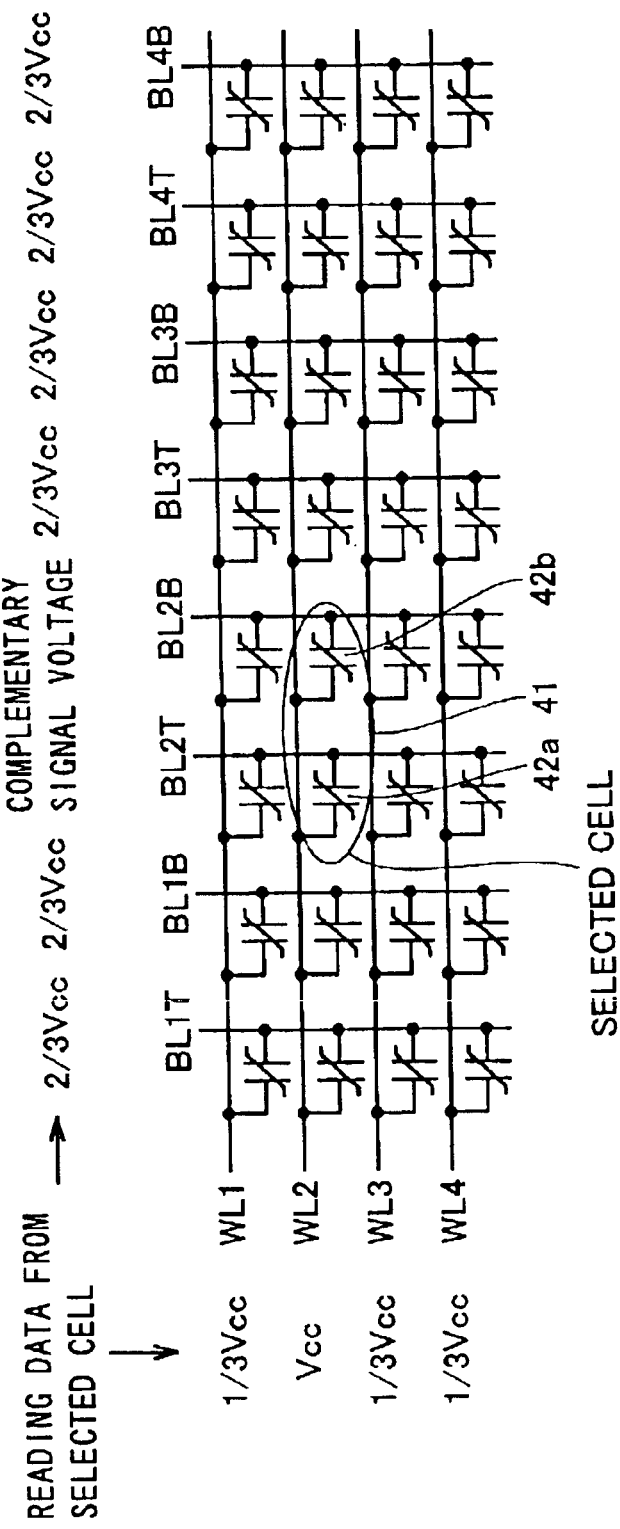

In reading, voltages applied to the word lines WL1 to WL4 and the bit lines BL1T and BL1B to BL4T and BL4B are set as shown in FIG. 7 thereby precharging the selected pair of bit lines BL2T and BL2B to 0 V. After this precharging, the pair of bit lines BL2T and BL2B are brought into Hi-Z (high impedance) states at 0 V while the selected word line WL2 is set to the voltage Vcc as shown in FIG. 8, thereby obtaining complementary signal voltages corresponding to the data of the selected cell 41 on the selected pair of bit lines BL2T and BL2B. The complementary signal voltages are amplified by a read amplifier and output from an output buffer. The pair of bit lines BL2T and BL2B may alternatively be precharged to a voltage level other than 0 V.

Also in the second embodiment, the read operation is destructively performed similarly to the first embodiment, and hence the data settled by the read amplifier must be rewritten (restored) in the selected cell 41. This rewrite operation is carried out similarly to the aforementioned data write operation. In other words, the ferroelectric memory rewrites the data "0" in the ferroelectric capacitors 42a and 42b connected with the bit lines BL2T and BL2B respectively at the voltages shown in FIG. 5 while rewriting the data "1" therein at the voltages shown in FIG. 6. Thereafter the ferroelectric memory returns all word lines WL1 to WL4 and all pairs of bit lines BL1T and BL1B to BL4T and BL4B to standby states of ½ Vcc, thereby terminating the write operation According to the second embodiment, the ferroelectric memory sets the voltages applied to the word lines WL1 to WL4 and the pairs of bit lines BL1T and BL1B to BL4T and BL4B so that the voltage applied to the ferroelectric capacitors 42a and 42b of the non-selected cells 41 is ⅓ Vcc at the maximum as hereinabove described, whereby the non-selected memory cells 41 can be effectively prevented from a disturbance phenomenon.

According to the second embodiment, further, each memory cell 41 is formed by only the two ferroelectric capacitors 42a and 42b similarly to the aforementioned first embodiment, whereby the areas of the memory cells 41 can be reduced as compared with the conventional 2T2C memory cells each consisting of two transistors and two ferroelectric capacitors, for improving the degree of integration. Further, the ferroelectric memory writing complementary data in the two ferroelectric capacitors 42a and 42b of each memory cell 41 requires no reference voltage and can increase initial potential difference in reading as compared with a case of employing a reference voltage. Also when the characteristics of the ferroelectric capacitors 42a and 42b are deteriorated due to fabrication dispersion or increase of the number of writing/reading times, therefore, the ferroelectric memory can be effectively prevented from false data reading.

(Third Embodiment)

Figure 9:
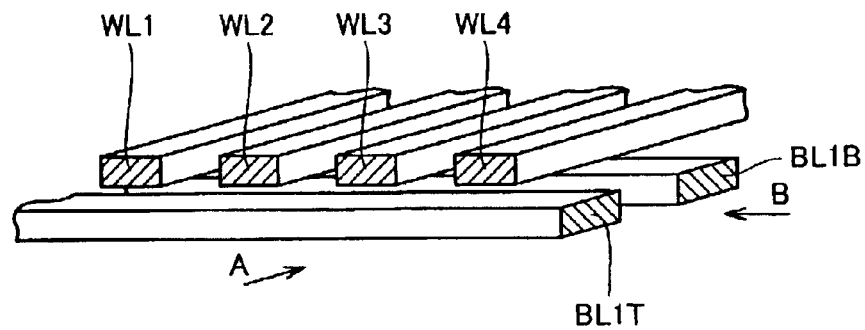
FIG. 9 is a perspective view showing the structure of a memory cell array part of a ferroelectric memory according to a third embodiment of the present invention.
Figure 10:
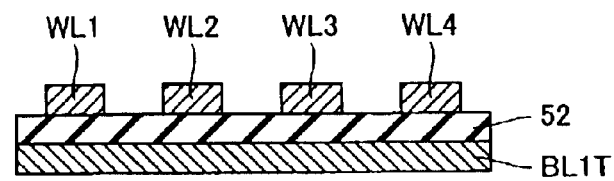
FIG. 10 is a sectional view of the memory cell array part of the ferroelectric memory according to the third embodiment shown in FIG. 9 as viewed from a direction A.
Figure 11:
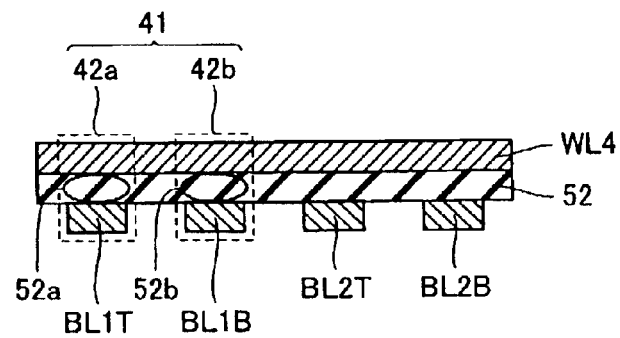
FIG. 11 is a sectional view of the memory cell array part of the ferroelectric memory according to the third embodiment shown in FIG. 9 as viewed from a direction B.

FIGS. 9 to 11 show the structure of a memory cell array part of a ferroelectric memory according to a third embodiment of the present invention. According to the third embodiment, a ferroelectric layer 52 forming ferroelectric capacitors 42a and 42b has a single-level structure. Referring to FIG. 9, the ferroelectric layer 52 is omitted for facilitating understanding of interconnection structures of bit lines BL1T, BL1B, BL2T and BL2B and word lines WL1, WL2, WL3 and WL4.

According to the third embodiment, the bit lines BL1T, BL1B, BL2T and BL2B and the word lines WL1 to WL4 are arranged to intersect with each other in the form of a matrix. The single ferroelectric layer 52 is arranged between the word lines WL1 to WL4 and the bit lines BL1T, BL1B, BL2T and BL2B. The ferroelectric layer 52 is an example of the "capacitance means" and the "data storage layer" in the present invention.

As shown in FIG. 11, a data storage part 52a of the ferroelectric layer 52, the word line WL4 located on the data storage part 52a and the bit line BL1T located under the data storage part 52a form a first ferroelectric capacitor 42a. Further, a data storage part 52b of the ferroelectric layer 52, the word line WL4 located on the data storage part 52b and the bit line BL1B located under the data storage part 52b form a second ferroelectric capacitor 42b. The first and second ferroelectric capacitors 42a and 42b form a single memory cell 41.

The data storage parts 52a and 52b of the ferroelectric capacitors 42a and 42b store complementary data.

In the ferroelectric memory according to the third embodiment, each memory cell 41 consisting of only two ferroelectric capacitors 42a and 42b can be easily formed due to the aforementioned structure. Thus, the areas of the memory cells 41 can be reduced as compared with the conventional 2T2C memory cells each consisting of two transistors and two ferroelectric capacitors, whereby the degree of integration can be improved.

The data storage parts 52a and 52b storing complementary data, transversely adjacently arranged in the third embodiment, may alternatively be transversely unadjacently arranged. In the aforementioned structure of the ferroelectric memory according to the third embodiment, further, the word lines WL1 to WL4 and the bit lines BL1T, BL1B, BL2T and BL2B may alternatively be arranged vertically oppositely to each other.

(Fourth Embodiment)

Figure 12:
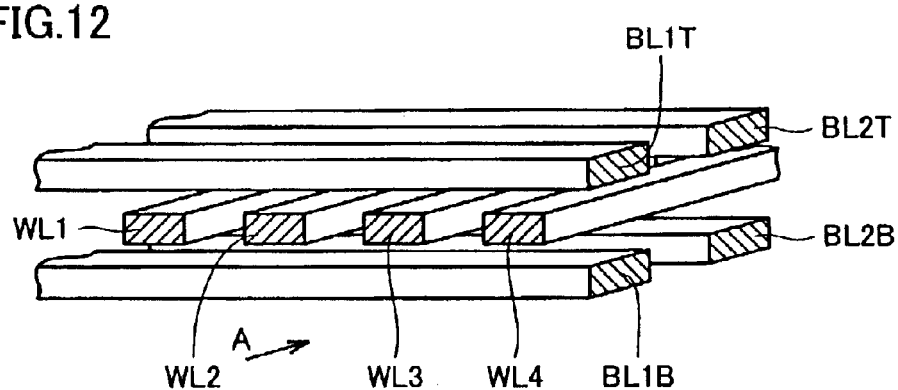
FIG. 12 is a perspective view showing the structure of a memory cell array part of a ferroelectric memory according to a fourth embodiment of the present invention.
Figure 13:
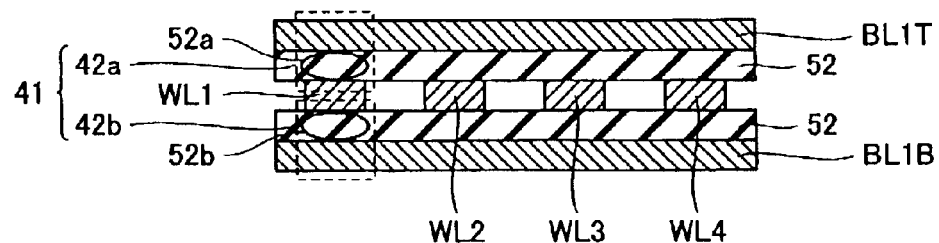
FIG. 13 is a sectional view of the memory cell array part of the ferroelectric memory according to the fourth embodiment shown in FIG. 12 as viewed from a direction A.

FIGS. 12 and 13 show the structure of a memory cell array part of a ferroelectric memory according to a fourth embodiment of the present invention. According to the fourth embodiment, two ferroelectric layers 52 are employed for forming ferroelectric capacitors 42a and 42b, dissimilarly to the aforementioned third embodiment. Referring to FIG. 12, the ferroelectric layers 52 are omitted for facilitating understanding of interconnection structures of bit lines BL1T, BL2T, BL1B and BL2B and word lines WL1, WL2, WL3 and WL4.

In the ferroelectric memory according to the fourth embodiment, the bit lines BL1T and BL2T and the bit lines BL1B and BL2B are formed above and under the word lines WL1 to WL4 respectively, as shown in FIGS. 12 and 13. The ferroelectric layers 52 are formed between the upper bit lines BL1T and BL2T and the word lines WL1 to WL4 and between the lower bit lines BL1B and BL2B and the word lines WL1 to WL4 respectively. In other words, the ferroelectric memory has two ferroelectric layers 52.

A data storage part 52a of the upper ferroelectric layer 52, the word line WL1 and the upper bit line BL1T form an upper ferroelectric capacitor 42a. A data storage part 52b of the lower ferroelectric layer 52, the word line WL1 and the lower bit line BL1B form a lower ferroelectric capacitor 42b. The upper and lower ferroelectric capacitors 42a and 42b form a single memory cell 41. According to this structure, the word line WL1 serves both as a lower electrode of the upper ferroelectric capacitor 42a and as an upper electrode of the lower ferroelectric capacitor 42b. The data storage parts 52a and 52b of the upper and lower ferroelectric capacitors 42a and 42b store complementary data.

The ferroelectric memory according to the fourth embodiment has the two ferroelectric layers 52 forming the ferroelectric capacitors 42a and 42b as hereinabove described, whereby the degree of integration can be further improved as compared with the ferroelectric memory according to the third embodiment having the single ferroelectric layer 52.

Figure 14:
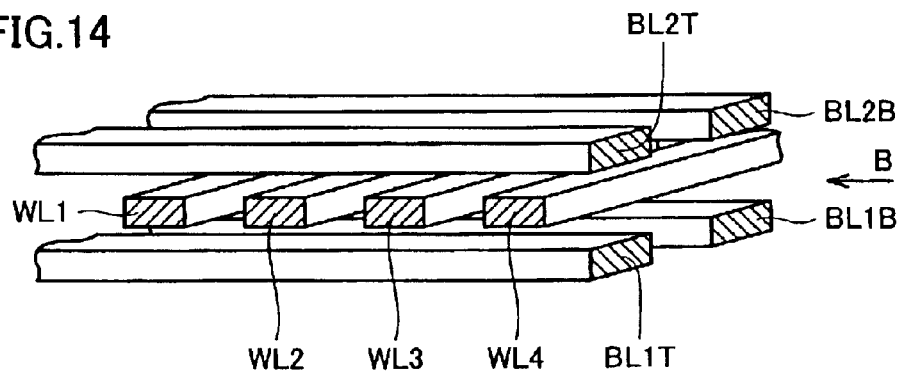
FIG. 14 is a perspective view showing the structure of a memory cell array part of a ferroelectric memory according to a first modification of the fourth embodiment of the present invention.
Figure 15:
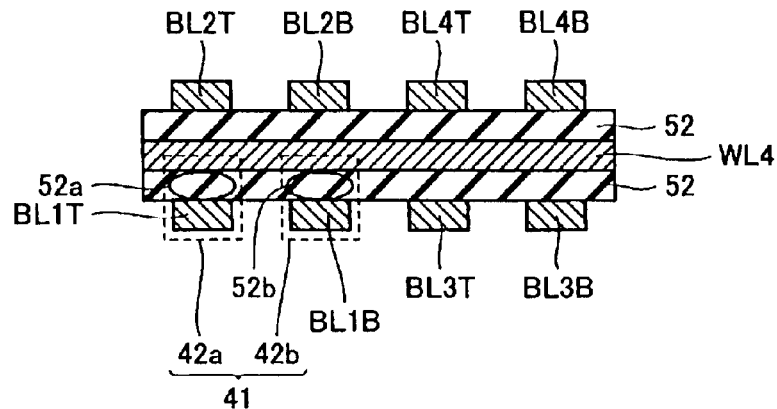
FIG. 15 is a sectional view of the memory cell array part of the ferroelectric memory according to the first modification of the fourth embodiment shown in FIG. 14 as viewed from a direction B.

FIGS. 14 and 15 show a ferroelectric memory according to a first modification of the fourth embodiment. Referring to FIGS. 14 and 15, ferroelectric capacitors 42a and 42b forming memory cells 41 are transversely adjacently formed in the ferroelectric memory according to the first modification of the fourth embodiment, dissimilarly to the ferroelectric memory according to the fourth embodiment shown in FIGS. 12 and 13. The ferroelectric memory according to the first modification of the fourth embodiment also has two ferroelectric layers 52, and hence the degree of integration can be improved similarly to the ferroelectric memory according to the fourth embodiment.

Figure 16:
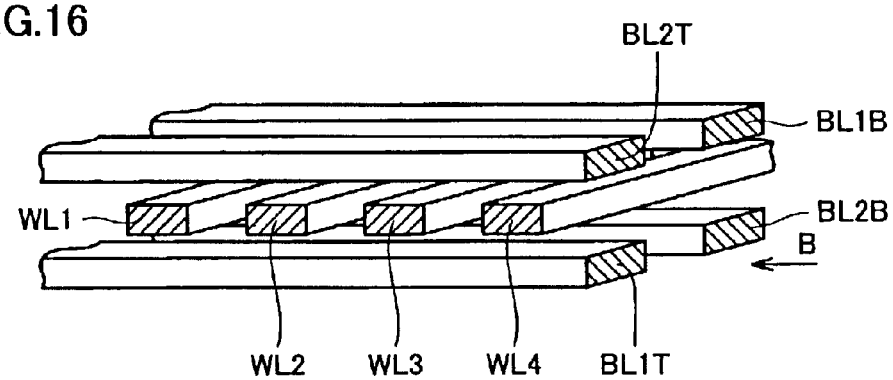
FIG. 16 is a perspective view showing the structure of a memory cell array part of a ferroelectric memory according to a second modification of the fourth embodiment of the present invention.
Figure 17:
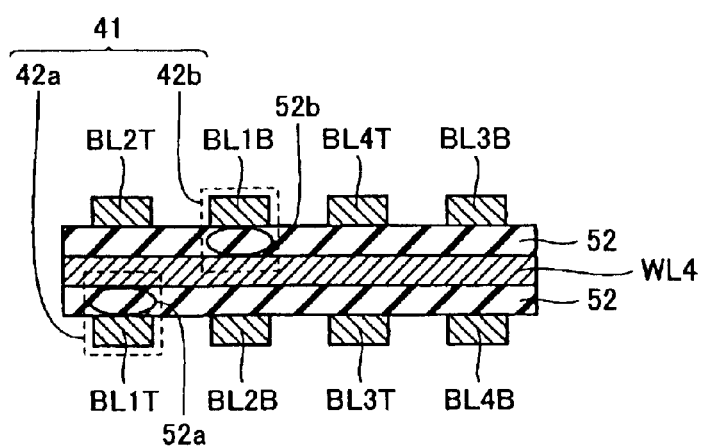
FIG. 17 is a sectional view of the memory cell array part of the ferroelectric memory according to the second modification of the fourth embodiment shown in FIG. 16 as viewed from a direction B.

FIGS. 16 and 17 show a ferroelectric memory according to a second modification of the fourth embodiment. Referring to FIGS. 16 and 17, ferroelectric capacitors 42a and 42b forming each memory cell 41 are obliquely adjacently arranged in the ferroelectric memory according to the second modification of the fourth embodiment. Also according to this structure, the ferroelectric memory can have two ferroelectric layers 52 forming the ferroelectric capacitors 42a and 42b similarly to the fourth embodiment, whereby the degree of integration can be improved as compared with the ferroelectric memory according to the third embodiment having the single ferroelectric layer 52. In the second modification of the fourth embodiment, the ferroelectric capacitors 42a and 42b may not necessarily be obliquely adjacent to each other but may be formed on obliquely separate positions.

(Fifth Embodiment)

Figure 18:
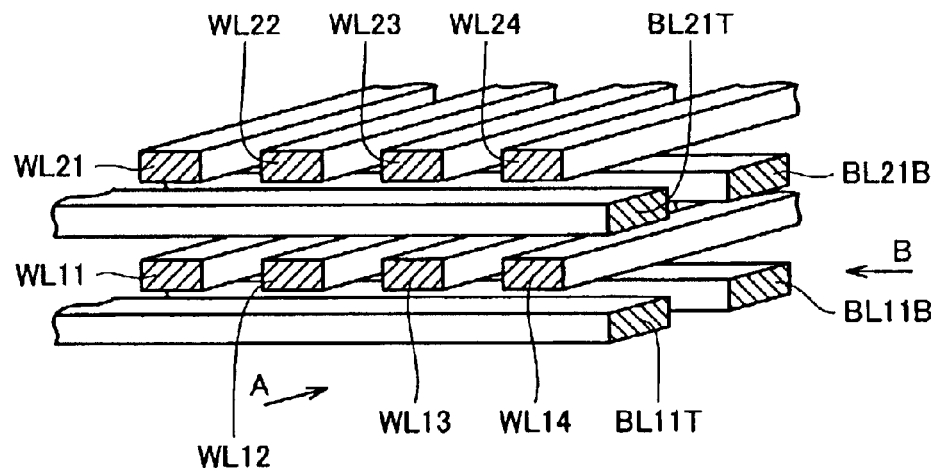
FIG. 18 is a perspective view showing the structure of a memory cell array part of a ferroelectric memory according to a fifth embodiment of the present invention.
Figure 19:
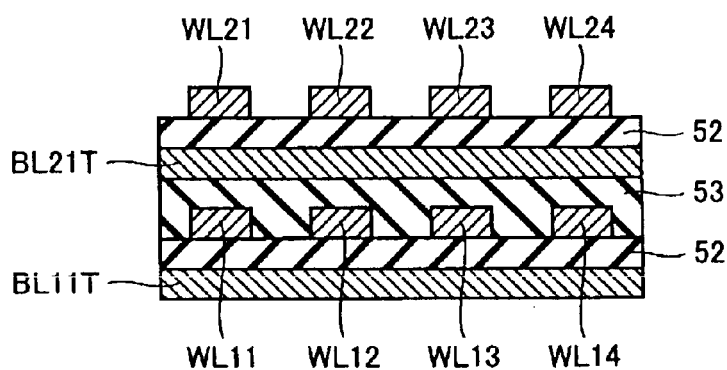
FIG. 19 is a sectional view of the memory cell array part of the ferroelectric memory according to the fifth embodiment shown in FIG. 18 as viewed from a direction A.
Figure 20:
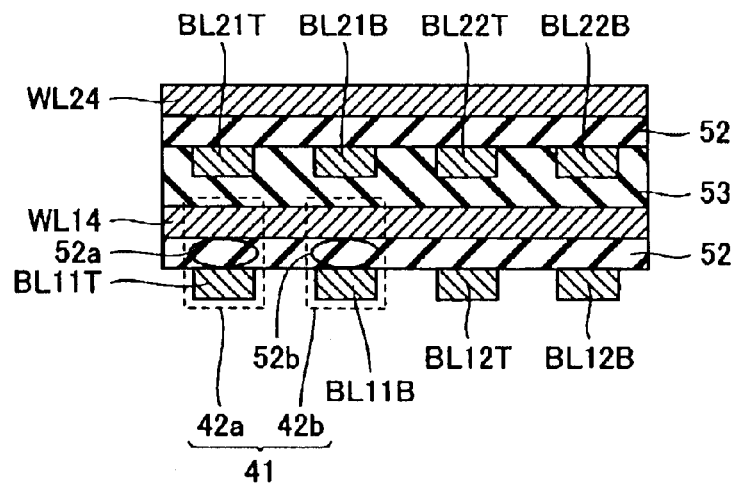
FIG. 20 is a sectional view of the memory cell array part of the ferroelectric memory according to the fifth embodiment shown in FIG. 18 as viewed from a direction B.

FIGS. 18 to 20 show the structure of a memory cell array part of a ferroelectric memory according to a fifth embodiment of the present invention. Referring to FIGS. 18 to 20, the ferroelectric memory according to the fifth embodiment is provided with two levels of word lines WL11 to WL14 and WL21 to WL24 and two levels of bit lines BL11T, BL11B, BL12T, BL12B, BL21T, BL21B, BL22T and BL22B respectively. Referring to FIG. 18, ferroelectric layers 52 and an insulator layer 53 are omitted for facilitating understanding of interconnection structures of the word lines WL11 to WL14 and WL21 to WL24 and the bit lines BL11T, BL11B, BL12T, BL12B, BL21T, BL21B, BL22T and BL22B.

In the ferroelectric memory according to the fifth embodiment, the first-level word lines WL11, WL12, WL13 and WL14 are formed on the first-level bit lines BL11T, BL11B, BL12T and BL12B through the first ferroelectric layer 52, as shown in FIGS. 18 to 20. The insulator layer 53 is formed to cover the first-level word lines WL11, WL12, WL13 and WL14. The second-level bit lines BL21T, BL21B, BL22T and BL22B are formed on the insulator layer 53. The second-level word lines WL21, WL22, WL23 and WL24 are formed on the second-level bit lines BL21T, BL21B, BL22T and BL22B through the second ferroelectric layer 52.

According to the fifth embodiment, further, a data storage part 52a of the first ferroelectric layer 52, the bit line BL11T arranged under the data storage part 52a and the word line WL14 arranged on the data storage part 52a form a first ferroelectric capacitor 42a, as shown in FIG. 20. A data storage part 52b of the first ferroelectric layer 52, the first-level bit line BL11B located under the data storage part 52b and the word line WL14 located on the data storage part 52b form a second ferroelectric capacitor 42b. The first and second ferroelectric capacitors 42a and 42b form a single memory cell 41. The data storage parts 52a and 52b of the first and second ferroelectric capacitors 42a and 42b store complementary data.

According to the fifth embodiment, the ferroelectric capacitors 42a and 42b forming each memory cell 41 are transversely adjacently arranged. The ferroelectric capacitors 42a and 42b may not necessarily be adjacent to each other but may be transversely arranged.

According to the fifth embodiment, the ferroelectric memory has the two ferroelectric layers 52 as hereinabove described, whereby the degree of integration can be improved as compared with the ferroelectric memory according to the third embodiment having the single ferroelectric layer 52.

(Sixth Embodiment)

Figure 21:
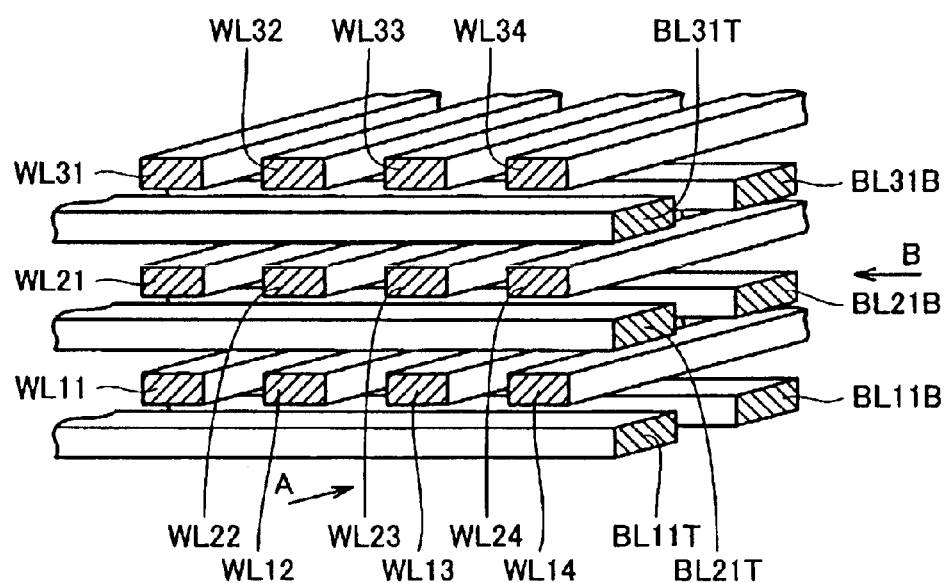
FIG. 21 is a perspective view showing the structure of a memory cell array part of a ferroelectric memory according to a sixth embodiment of the present invention.
Figure 22:
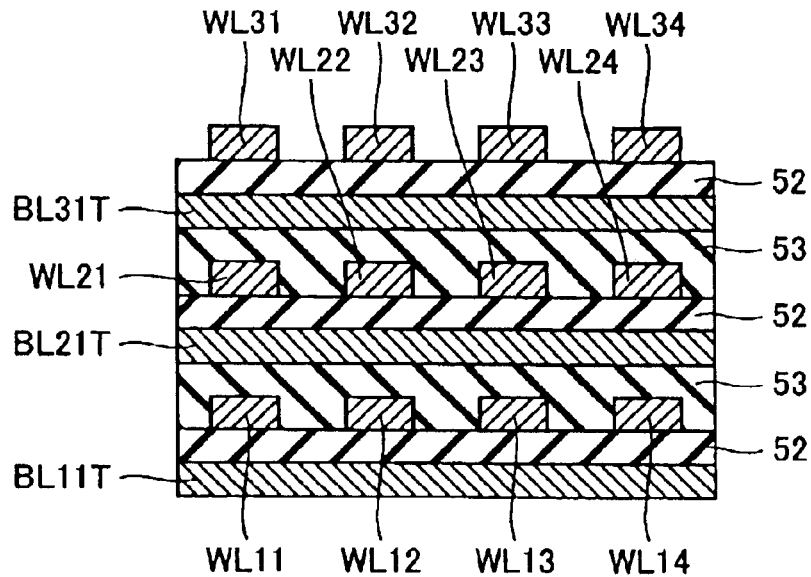
FIG. 22 is a sectional view of the memory cell array part of the ferroelectric memory according to the sixth embodiment shown in FIG. 21 as viewed from a direction A.
Figure 23:
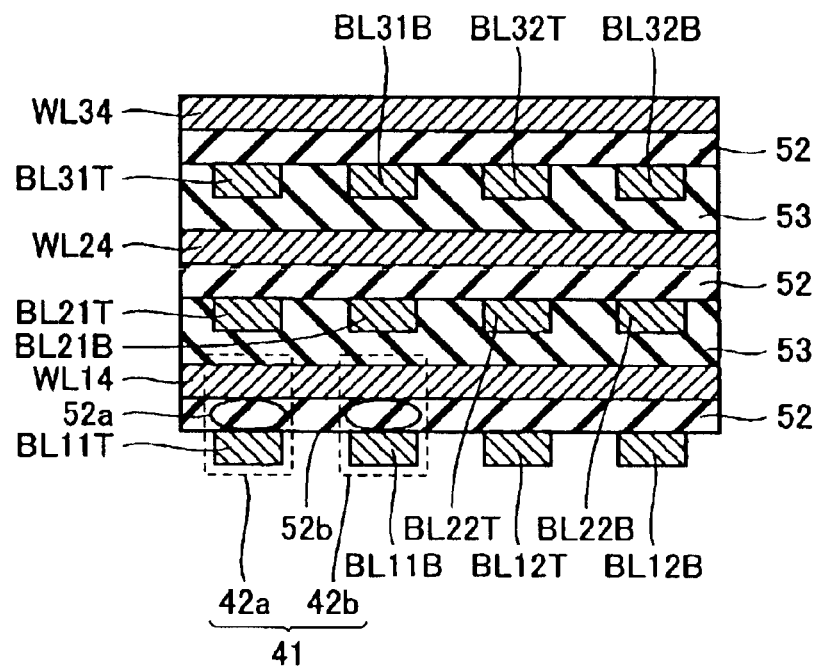
FIG. 23 is a sectional view of the memory cell array part of the ferroelectric memory according to the sixth embodiment shown in FIG. 21 as viewed from a direction B.

FIGS. 21 to 23 show the structure of a memory cell array part of a ferroelectric memory according to a sixth embodiment of the present invention. Referring to FIGS. 21 to 23, the ferroelectric memory according to the sixth embodiment has three ferroelectric layers 52 forming ferroelectric capacitors 42a and 42b. Referring to FIG. 21, the ferroelectric layers 52 and insulator layers 53 are omitted for facilitating understanding of interconnection structures of word lines WL11 to WL14, WL21 to WL24 and WL31 to WL34 and bit lines BL11T, BL11B, BL12T, BL12B, BL21T, BL21B, BL22T, BL22B, BL31T, BL31B, BL32T and BL32B.

In the ferroelectric memory according to the sixth embodiment, the first-level word lines WL11, WL12, WL13 and WL14 are formed on the first-level bit lines BL11T, BL11B, BL12T and BL12B through the first ferroelectric layer 52, as shown in FIGS. 21 to 23. The first insulator layer 53 is formed to cover the first-level word lines WL11, WL12, WL13 and WL14. The second-level bit lines BL21T, BL21B, BL22T and BL22B are formed on the first insulator layer 53. The second-level word lines WL21, WL22, WL23 and WL24 are formed on the second-level bit lines BL21T, BL21B, BL22T and BL22B through the second ferroelectric layer 52. The second insulator layer 53 is formed to cover the second-level word lines WL21, WL22, WL23 and WL24. The third-level bit lines BL31T, BL31B, BL32T and BL32B are formed on the second insulator layer 53. The third-level word lines WL31, WL32, WL33 and WL34 are formed on the third-level bit lines BL31T, BL31B, BL32T and BL32B through the third ferroelectric layer 52.

A data storage part 52a of the first ferroelectric layer 52, the first-level bit line BL11T located under the data storage part 52a and the word line WL14 located on the data storage part 52a form a first ferroelectric capacitor 42a. A data storage part 52b of the first ferroelectric layer 52, the first-level bit line BL11B located under the data storage part 52b and the first-level word line WL14 located on the data storage part 52b form a second ferroelectric capacitor 42b. The first and second ferroelectric capacitors 42a and 42b form a single memory cell 41. The data storage parts 52a and 52b store complementary data.

The ferroelectric capacitors 42a and 42b forming each memory cell 41 are transversely adjacently arranged. The ferroelectric capacitors 42a and 42b may not necessarily be adjacent to each other but may be transversely unadjacently arranged.

According to the sixth embodiment, the ferroelectric memory has the three ferroelectric layers 52 forming the ferroelectric capacitors 42a and 42b as hereinabove described, whereby the degree of integration can be improved as compared with the ferroelectric memory having the two ferroelectric layers 52.

(Seventh Embodiment)

Figure 24:
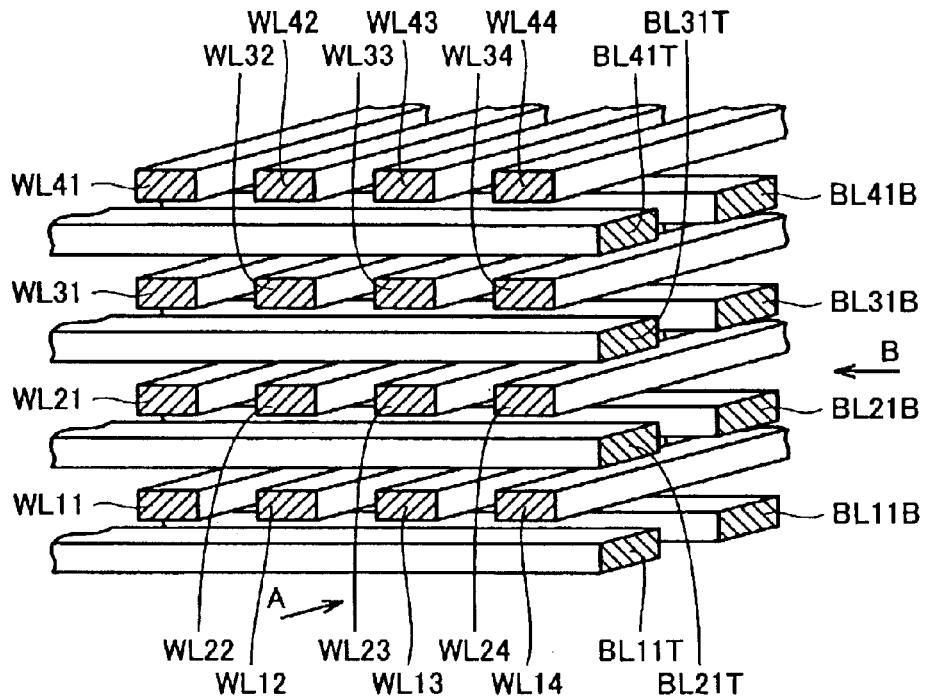
FIG. 24 is a perspective view showing the structure of a memory cell array part of a ferroelectric memory according to a seventh embodiment of the present invention.
Figure 25:
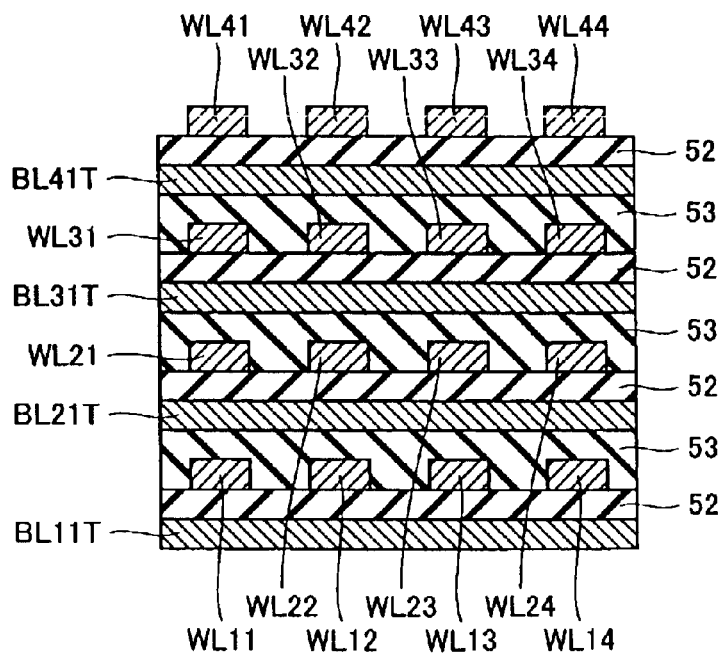
FIG. 25 is a sectional view of the memory cell array part of the ferroelectric memory according to the seventh embodiment shown in FIG. 24 as viewed from a direction A.
Figure 26:
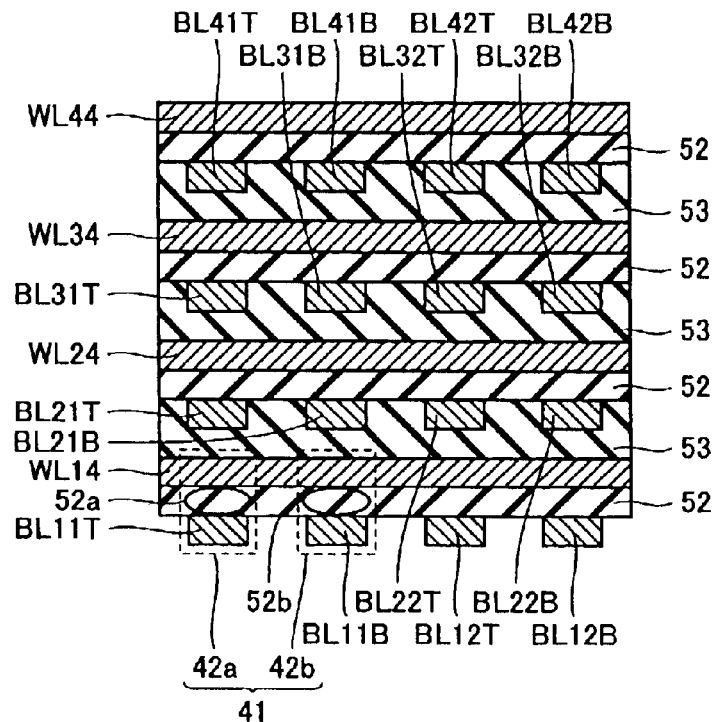
FIG. 26 is a sectional view of the memory cell array part of the ferroelectric memory according to the seventh embodiment shown in FIG. 24 as viewed from a direction B.

FIGS. 24 to 26 show the structure of a memory cell array part of a ferroelectric memory according to a seventh embodiment of the present invention. Referring to FIGS. 24 to 26, the ferroelectric memory according to the seventh embodiment has four ferroelectric layers 52 forming ferroelectric capacitors 42a and 42b. Referring to FIG. 24, the ferroelectric layers 52 and insulator layers 53 are omitted for facilitating understanding of interconnection structures of word lines WL11 to WL14, WL21 to WL24, WL31 to WL34 and WL41 to WL44 and bit lines BL11T, BL11B, BL12T, BL12B, BL21T, BL21B, BL22T, BL22B, BL31T, BL31B, BL32T, BL32B, BL41T, BL41B, BL42T and BL42B.

In the ferroelectric memory according to the seventh embodiment, the first-level word lines WL11, WL12, WL13 and WL14 are formed on the first-level bit lines BL11T, BL11B, BL12T and BL12B through the first ferroelectric layer 52. The first insulator layer 53 is formed to cover the first-level word lines WL11, WL12, WL13 and WL14. The second-level bit lines BL21T, BL21B, BL22T and BL22B are formed on the first insulator layer 53. The second-level word lines WL21, WL22, WL23 and WL24 are formed on the second-level bit lines BL21T, BL21B, BL22T and BL22B through the second ferroelectric layer 52. The second insulator layer 53 is formed to cover the second-level word lines WL21, WL22, WL23 and WL24. The third-level bit lines BL31T, BL31B, BL32T and BL32B are formed on the second insulator layer 53.

The third-level word lines WL31, WL32, WL33 and WL34 are formed on the third-level bit lines BL31T, BL31B, BL32T and BL32B through the third ferroelectric layer 52. The third insulator layer 53 is formed to cover the third-level word lines WL31, WL32, WL33 and WL34. The fourth-level bit lines BL41T, BL41B, BL42T and BL42B are formed on the third insulator layer 53. The fourth-level word lines WL41, WL42, WL43 and WL44 are formed on the fourth-level bit lines BL41T, BL41B, BL42T and BL42B through the fourth ferroelectric layer 52.

In the seventh embodiment, a data storage part 52a of the first ferroelectric layer 52, the first-level bit line BL11T located under the data storage part 52a and the word line WL14 located on the data storage part 52a form a first ferroelectric capacitor 42a, as shown in FIG. 26. A data storage part 52b of the first ferroelectric layer 52, the first-level bit line BL11B located under the data storage part 52b and the first-level word line WL14 located on the data storage part 52b form a second ferroelectric capacitor 42b. The first and second ferroelectric capacitors 42a and 42b form a single memory cell 41. The data storage parts 52a and 52b of the first and second ferroelectric capacitors 42a and 42b store complementary data.

According to the seventh embodiment, the ferroelectric capacitors 42a and 42b forming each memory cell 41 are transversely adjacently arranged. The ferroelectric capacitors 42a and 42b may not necessarily be adjacent to each other but may be transversely unadjacently arranged.

According to the seventh embodiment, the ferroelectric memory has the four ferroelectric layers 52 forming the ferroelectric capacitors 42a and 42b as hereinabove described, whereby the degree of integration can be further improved as compared with the ferroelectric memories according to the aforementioned third to sixth embodiments.

(Eighth Embodiment)

Figure 27:
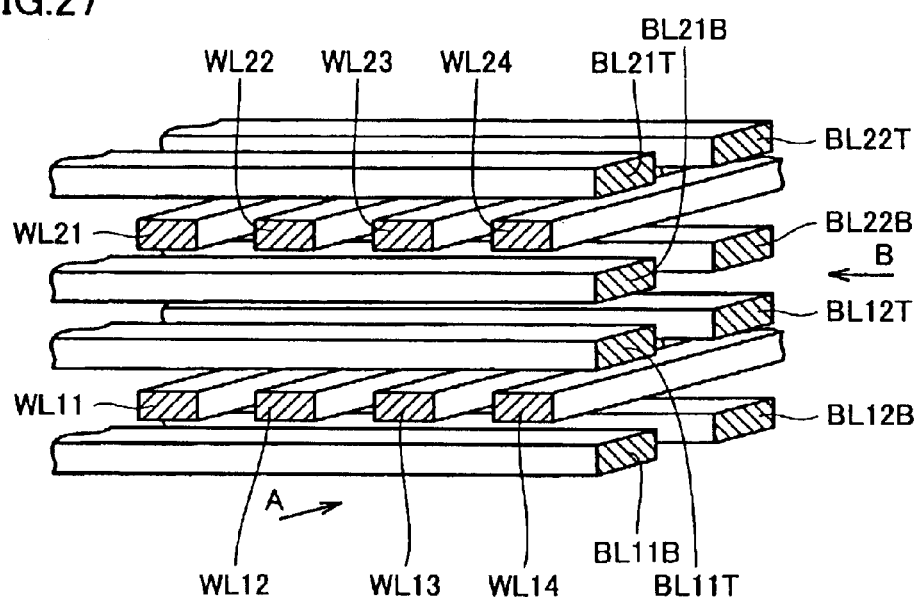
FIG. 27 is a perspective view showing the structure of a memory cell array part of a ferroelectric memory according to an eighth embodiment of the present invention.
Figure 28:
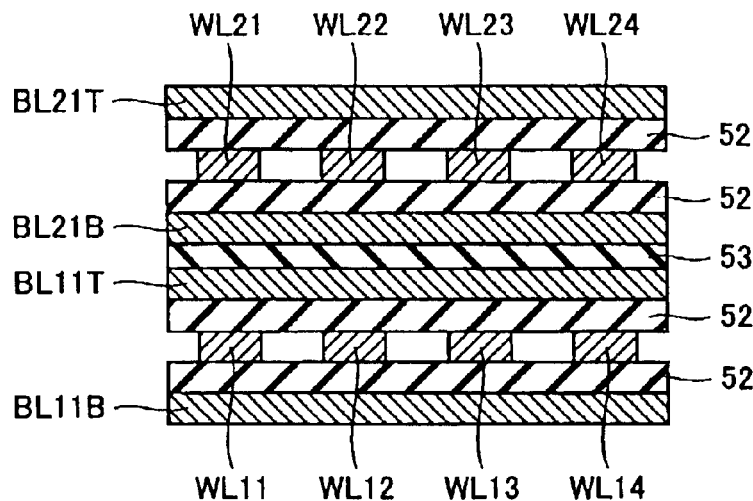
FIG. 28 is a sectional view of the memory cell array part of the ferroelectric memory according to the eighth embodiment shown in FIG. 27 as viewed from a direction A.
Figure 29:
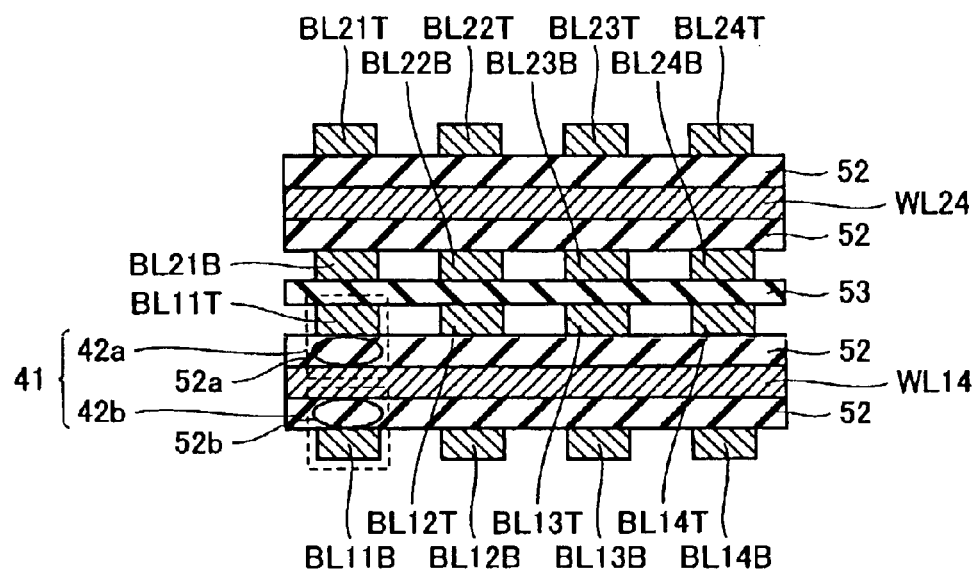
FIG. 29 is a sectional view of the memory cell array part of the ferroelectric memory according to the eighth embodiment shown in FIG. 27 as viewed from a direction B.

FIGS. 27 to 29 show the structure of a memory cell array part of a ferroelectric memory according to an eighth embodiment of the present invention. Referring to FIGS. 27 to 29, the ferroelectric memory according to the eighth embodiment has four ferroelectric layers 52 forming ferroelectric capacitors 42a and 42b, while the ferroelectric capacitors 42a and 42b forming each memory cell 41 are vertically arranged. Referring to FIG. 27, the ferroelectric layers 52 and an insulator layer 53 are omitted for facilitating understanding of interconnection structures of word lines WL11 to WL14 and WL21 to WL24 and bit lines BL11B, BL12B, BL13B, BL14B, BL11T, BL12T, BL13T, BL14T, BL21B, BL22B, BL23B, BL24B, BL21T, BL22T, BL23T and BL24T.

In the ferroelectric memory according to the eighth embodiment, the first-level word lines WL11, WL12, WL13 and WL14 are formed on the first-level bit lines BL11B, BL12B, BL13B and BL14B through the first ferroelectric layer 52, as shown in FIGS. 27 to 29. The second-level bit lines BL11T, BL12T, BL13T and BL14T are formed on the first-level word lines WL11, WL12, WL13 and WL14 through the second ferroelectric layer 52. The insulator layer 53 is formed on the second-level bit lines BL11T, BL12T, BL13T and BL14T. The third-level bit lines BL21B, BL22B, BL23B and BL24B are formed on the insulator layer 53. The second-level word lines WL21, WL22, WL23 and WL24 are formed on the third-level bit lines BL21B, BL22B, BL23B and BL24B through the third ferroelectric layer 52. The fourth-level bit lines BL21T, BL22T, BL23T and BL24T are formed on the second-level word lines WL21, WL22, WL23 and WL24 through the fourth ferroelectric layer 52.

As shown in FIG. 29, a data storage part 52a of the second ferroelectric layer 52, the first-level word line WL14 located under the data storage part 52a and the second-level bit line BL11T located on the data storage part 52a form a first ferroelectric capacitor 42a. A data storage part 52b of the first ferroelectric layer 52, the first-level bit line BL11B located under the data storage part 52b and the first-level word line WL14 located on the data storage part 52b form a second ferroelectric capacitor 42b. The first and second ferroelectric capacitors 42a and 42b form a single memory cell 41. The data storage parts 52a and 52b of the first and second ferroelectric capacitors 42a and 42b store complementary data.

According to the eighth embodiment, the ferroelectric capacitors 42a and 42b are vertically adjacently arranged. The ferroelectric capacitors 42a and 42b may not necessarily be vertically adjacent to each other but may be transversely or obliquely arranged.

Also in the eighth embodiment, the ferroelectric memory has the four ferroelectric layers 52 forming the ferroelectric capacitors 42a and 42b similarly to the seventh embodiment, whereby the degree of integration can be further improved as compared with the ferroelectric memories according to the aforementioned third to sixth embodiments.

(Ninth Embodiment)

Figure 30:
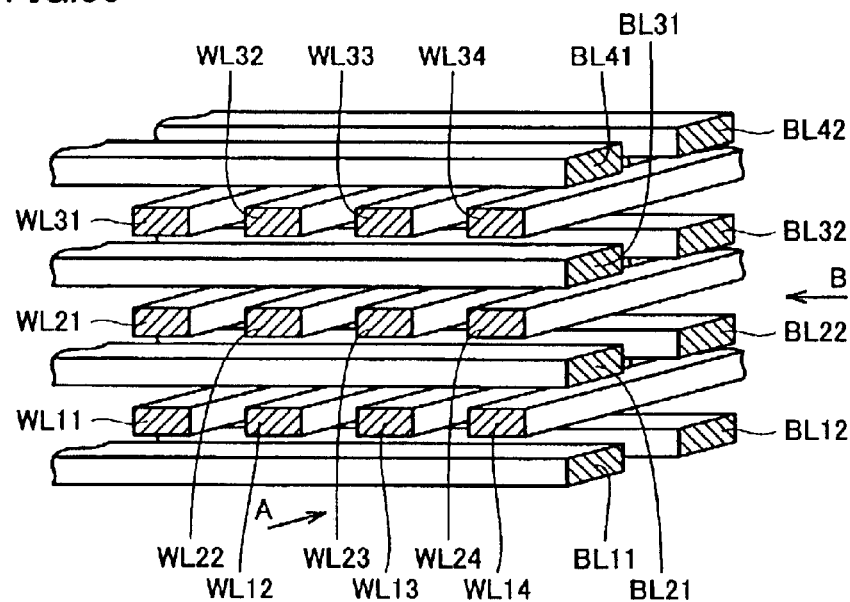
FIG. 30 is a perspective view showing the structure of a memory cell array part of a ferroelectric memory according to a ninth embodiment of the present invention.
Figure 31:
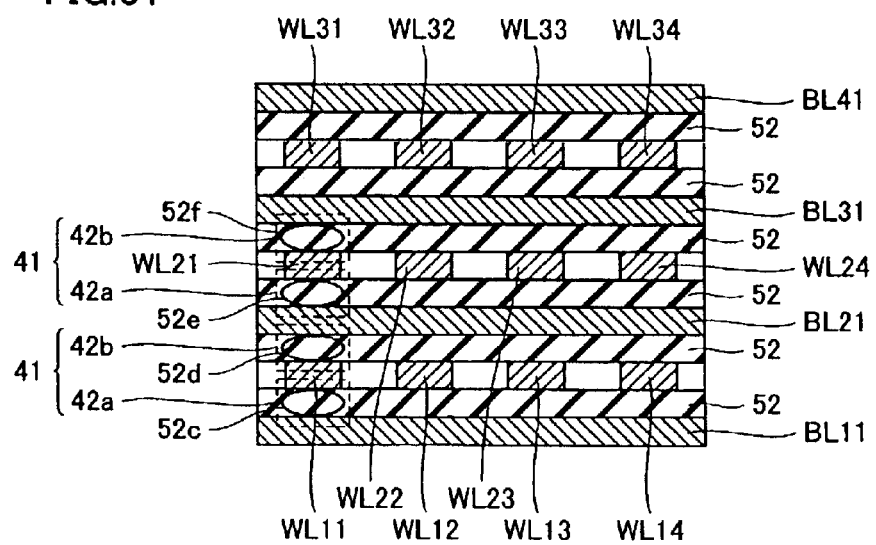
FIG. 31 is a sectional view of the memory cell array part of the ferroelectric memory according to the ninth embodiment shown in FIG. 30 as viewed from a direction A.
Figure 32:
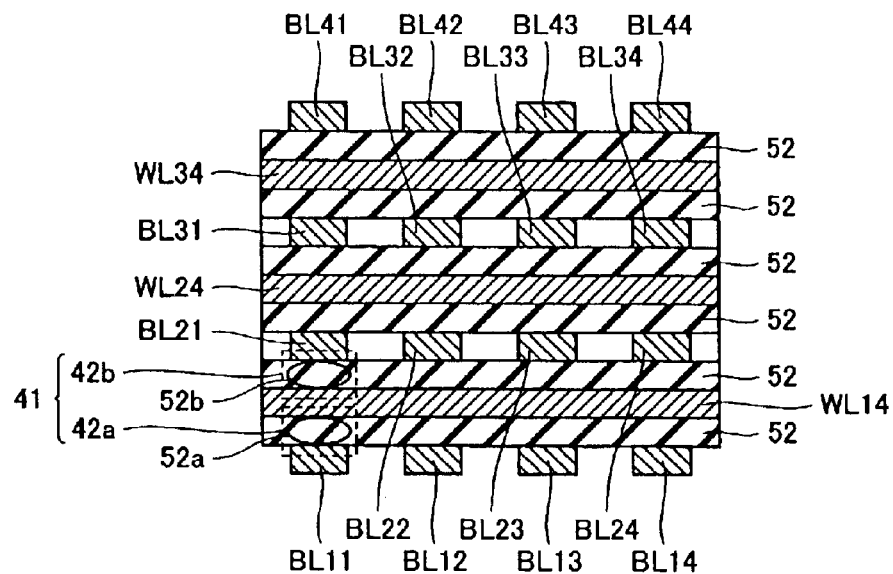
FIG. 32 is a sectional view of the memory cell array part of the ferroelectric memory according to the ninth embodiment shown in FIG. 30 as viewed from a direction B.

FIGS. 30 to 32 show the structure of a memory cell array part of a ferroelectric memory according to a ninth embodiment of the present invention. Referring to FIGS. 30 to 32, the ferroelectric memory according to the ninth embodiment has six ferroelectric layers 52 forming ferroelectric capacitors 42a and 42b. Referring to FIG. 30, the ferroelectric layers 52 are omitted for facilitating understanding of interconnection structures of bit lines BL11 to BL14, BL21 to BL22, BL31 to BL34 and BL41 to BL44 and word lines WL11 to WL14, WL21 to WL24 and WL31 to WL34.

In the ferroelectric memory according to the ninth embodiment, the first-level word lines WL11, WL12, WL13 and WL14 are formed on the first-level bit lines BL11, BL12, BL13 and BL14 through the first ferroelectric layer 52, as shown in FIGS. 30 to 32. The second-level bit lines BL21, BL22, BL23 and BL24 are formed on the first-level word lines WL11, WL12, WL13 and WL14 through the second ferroelectric layer 52. The second-level word lines WL21, WL22, WL23 and WL24 are formed on the second-level bit lines BL21, BL22, BL23 and BL24 through the third ferroelectric layer 52. The third-level bit lines BL31, BL32, BL33 and BL34 are formed on the second-level word lines WL21, WL22, WL23 and WL24 through the fourth ferroelectric layer 52. The third-level word lines WL31, WL32, WL33 and WL34 are formed on the third-level bit lines BL31, BL32, BL33 and BL34 through the fifth ferroelectric layer 52. The fourth-level bit lines BL41, BL42, BL43 and BL44 are formed on the third-level word lines WL31, WL32, WL33 and WL34 through the sixth ferroelectric layer 52.

As shown in FIG. 32, a data storage part 52a of the first ferroelectric layer 52, the first-level bit line BL11 located under the data storage part 52a and the word line WL14 located on the data storage part 52a form a first ferroelectric capacitor 42a. A data storage part 52b of the second ferroelectric layer 52, the first-level word line WL14 located under the data storage part 52b and the second-level bit line BL21 located on the data storage part 52b form a second ferroelectric capacitor 42b. The first and second ferroelectric capacitors 42a and 42b form a single memory cell 41. The data storage parts 52a and 52b of the first and second ferroelectric capacitors 42a and 42b store complementary data 1 and 0 respectively.

As shown in FIG. 31, a data storage part 52c of the first ferroelectric layer 52, the first-level bit line BL11 located under the data storage part 52c and the word line WL11 located on the data storage part 52c form another first ferroelectric capacitor 42a. A data storage part 52d of the second ferroelectric layer 52, the first-level word line WL11 located under the data storage part 52d and the second-level bit line BL21 located on the data storage part 52d form another second ferroelectric capacitor 42b. The first and second ferroelectric capacitors 42a and 42b form another single memory cell 41. The data storage parts 52c and 52d of the first and second ferroelectric capacitors 42a and 42b store complementary data 1 and 0 respectively.

As shown in FIG. 31, a data storage part 52e of the third ferroelectric layer 52, the second-level bit line BL21 located under the data storage part 52e and the second-level word line WL21 located on the data storage part 52e form still another first ferroelectric capacitor 42a. A data storage part 52f of the fourth ferroelectric layer 52, the second-level word line WL21 located under the data storage part 52f and the third-level bit line BL31 located on the data storage part 52f form still another second ferroelectric capacitor 42b. The first and second ferroelectric capacitors 42a and 42b form still another single memory cell 41. The data storage parts 52e and 52f of the first and second ferroelectric capacitors 42a and 42b store complementary data 1 and 0.

More specifically, the bit lines BL11 and BL21 are employed for reading/writing the complementary data with respect to the word line WL11, as shown in FIG. 31. Further, the bit lines BL21 and BL31 are employed for reading/writing the complementary data with respect to the word line WL21. In this case, vertically adjacent memory cells 41 can share the bit line BL21, whereby the number of interconnection layers can be reduced. In other words, the bit lines BL11 to BL14, BL21 to BL24, BL31 to BL34 and BL41 to BL44 can be provided in four levels and word lines WL11 to WL14, WL21 to WL24 and WL31 to WL34 can be provided in three levels according to the ninth embodiment despite the six ferroelectric layers 52.

In the ferroelectric memory according to the ninth embodiment having the six ferroelectric layers 52 forming the ferroelectric capacitors 42a and 42b as hereinabove described, the degree of integration can be further improved as compared with the aforementioned third to eighth embodiments.

The ferroelectric capacitors 42a and 42b forming each memory cell 41, vertically arranged in the ninth embodiment, may alternatively be obliquely arranged.

(Tenth Embodiment)

Figure 33:
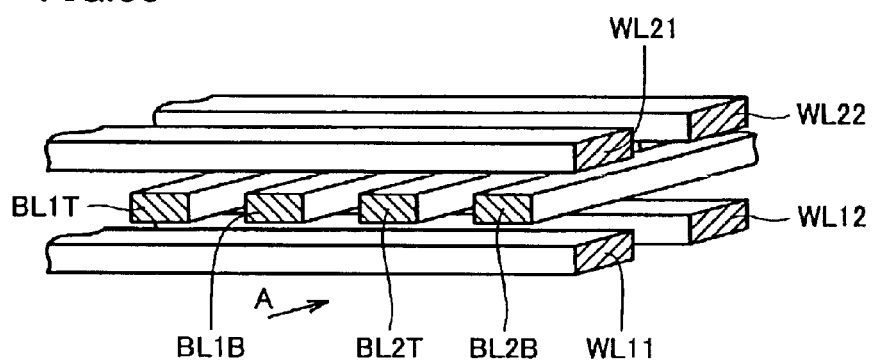
FIG. 33 is a perspective view showing the structure of a memory cell array part of a ferroelectric memory according to a tenth embodiment of the present invention.
Figure 34:
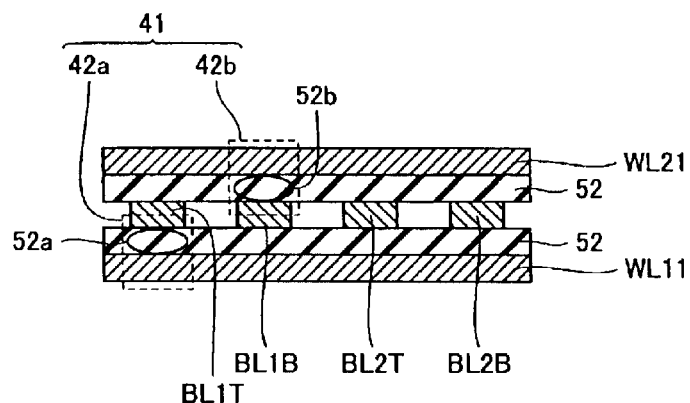
FIG. 34 is a sectional view of the memory cell array part of the ferroelectric memory according to the tenth embodiment shown in FIG. 33 as viewed from a direction A.

FIGS. 33 and 34 show the structure of a memory cell array part of a ferroelectric memory according to a tenth embodiment of the present invention. In the ferroelectric memory according to the tenth embodiment, word lines WL21 and WL22 and word lines WL11 and WL12 are arranged on and under bit lines BL1T, BL1B, BL2T and BL2B respectively. Referring to FIG. 33, ferroelectric layers 52 are omitted for facilitating understanding of interconnection structures of the bit lines BL1T, BL1B, BL2T and BL2B and the word lines WL11, WL12, WL21 and WL22.

In the ferroelectric memory according to the tenth embodiment, the bit lines BL1T, BL1B, BL2T and BL2B are formed on the first-level word lines WL11 and WL12 through the first ferroelectric layer 52, as shown in FIGS. 33 and 34. The second-level word lines WL21 and WL22 are formed on the bit lines BL1T, BL1B, BL2T and BL2B through the second ferroelectric layer 52. A data storage part 52a of the first ferroelectric layer 52, the first-level word line WL11 located under the data storage part 52a and the bit line BL1T located on the data storage part 52a form a first ferroelectric capacitor 42a. A data storage part 52b of the second ferroelectric layer 52, the bit line BL1B located under the data storage part 52b and the second-level word line WL21 located on the data storage part 52b form a second ferroelectric capacitor 42b. The first and second ferroelectric capacitors 42a and 42b form a single memory cell 41.

In the ferroelectric memory according to the tenth embodiment, the ferroelectric capacitors 42a and 42b forming each memory cell 41 are obliquely adjacently arranged. The data storage parts 52a and 52b store complementary data. The ferroelectric capacitors 42a and 42b may not necessarily be obliquely adjacently arranged but may be arranged on obliquely separate positions.

According to the tenth embodiment, the word lines WL11 and WL21 are driven with a time lag in read and write operations. Thus, the ferroelectric memory according to the tenth embodiment can read/write data.

Also in the ferroelectric memory according to the tenth embodiment having the two ferroelectric layers 52, the degree of integration can be further improved as compared with the ferroelectric memory having the single ferroelectric layer 52.

Although the present invention has been described and illustrated in detail, it is clearly understood that the same is by way of illustration and example only and is not to be taken by way of limitation, the spirit and scope of the present invention being limited only by the terms of the appended claims.

For example, while each of the above embodiments has been described with reference to a ferroelectric memory having ferroelectric capacitors, the present invention is not restricted to this but is also applicable to a memory including capacitance means other than the ferroelectric capacitors.

While the ferroelectric memory according to the aforementioned second embodiment sets the voltages applied to the word lines WL1 to WL4 and the bit lines BL1T and BL1B to BL4T and BL4B so that the voltage applied to the ferroelectric capacitors 42a and 42b of the non-selected cells 41 is ⅓ Vcc at the maximum thereby reducing disturbance of the non-selected memory cells 41, the present invention is not restricted to this but the ferroelectric memory may alternatively reduce disturbance of the non-selected memory cells 41 by another method in place of the ⅓ Vcc method. For example, the ferroelectric memory may reduce the disturbance by applying voltage pulses to the selected cell 41 and the non-selected cells 41 while controlling the times for applying the pulses.

Figure 35:
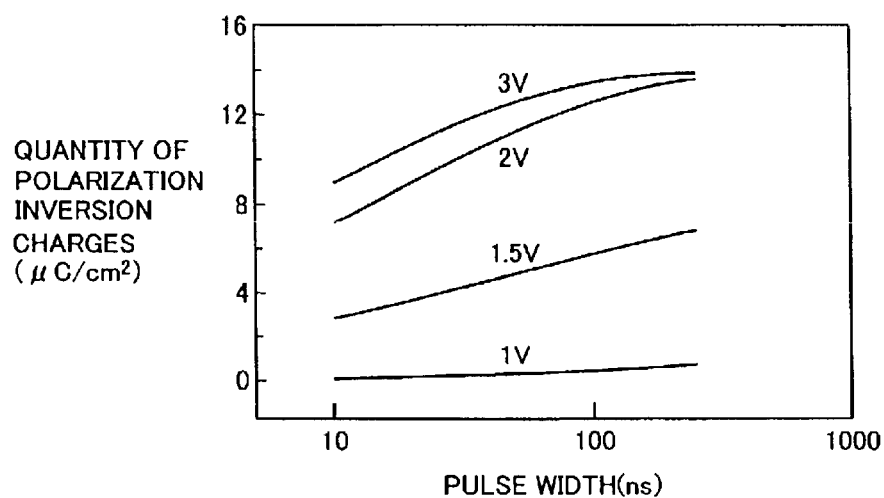
FIG. 35 is a correlation diagram for illustrating the principle of a method of reducing disturbance according to a modification of the second embodiment of the present invention.
Figure 36:
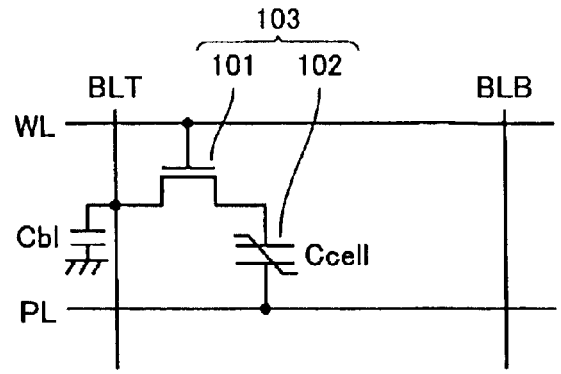
FIG. 36 is a circuit diagram showing a memory cell part of a conventional one-transistor one-capacitor (1T1C) ferroelectric memory.
Figure 37:
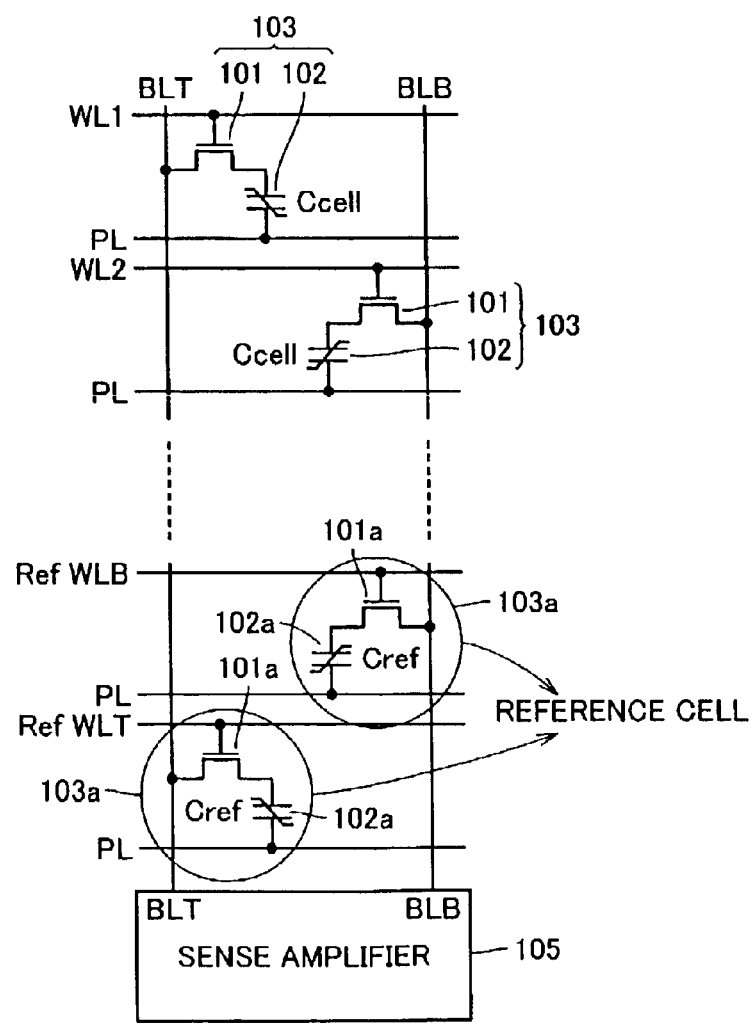
FIG. 37 is a circuit diagram for illustrating a read operation in the conventional 1T1C ferroelectric memory shown in FIG. 36.
Figure 38:
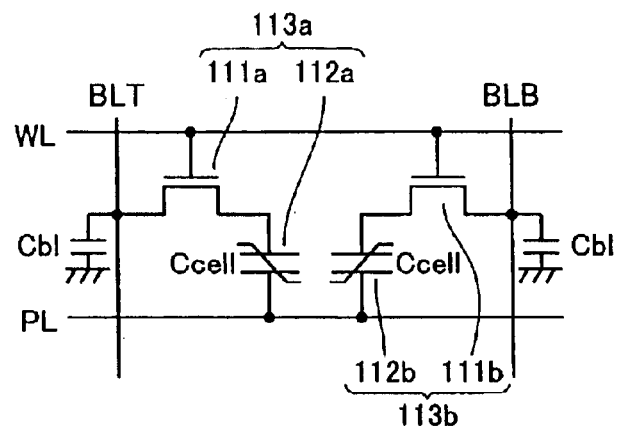
FIG. 38 is a circuit diagram showing a memory cell part of a conventional two-transistor two-capacitor (2T2C) ferroelectric memory.
Figure 39:
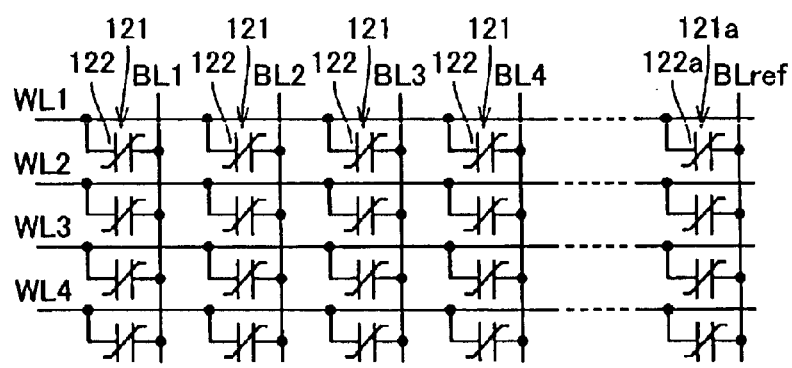
FIG. 39 is a circuit diagram showing a conventional matrix ferroelectric memory.
Figure 40:
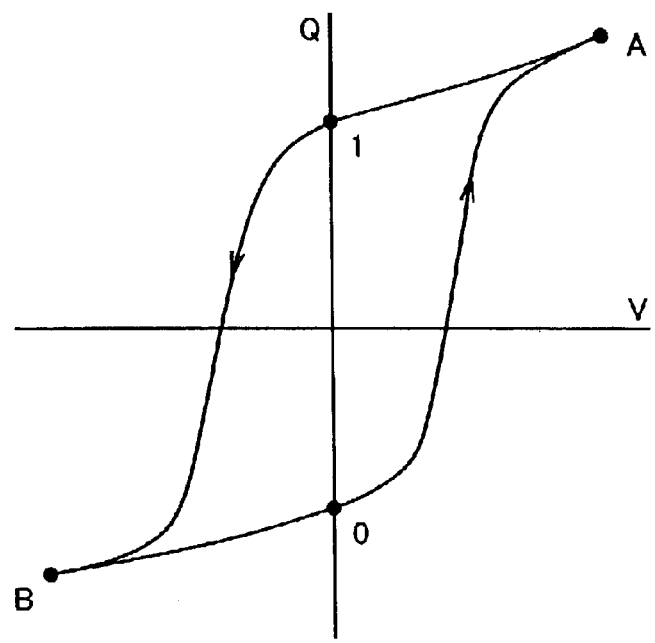
FIG. 40 is a hysteretic diagram for illustrating the operation principle of the conventional matrix ferroelectric memory shown in FIG. 39.

FIG. 35 is a correlation diagram for illustrating the aforementioned operation principle. This correlation diagram shows the relation between pulse widths and quantities of polarization inversion charges in a case of applying pulses to a ferroelectric capacitor employing an SBT film as a ferroelectric layer with parameters of applied voltages. As clearly understood from FIG. 35, the quantity of polarization inversion charges is substantially saturated at about 13 $\mu C/cm^2$ when the pulse width is not more than 70 nm and a high voltage (e.g., 3 V) is applied. On the other hand, it is also understood that substantially no polarization inversion is caused when a low voltage (e.g., 1.0 V) is applied.

Thus, dipoles of a ferroelectric substance, which are inverted under a high voltage, substantially remain unmoved under a low voltage when the pulse width is relatively small. When a high voltage pulse is applied to a selected cell with a small pulse width while applying a low voltage pulse to non-selected cells with a small pulse width, therefore, voltages necessary for writing and reading can be applied to ferroelectric layers of the selected cell while causing no change in molecular structure in ferroelectric layers of the non-selected cells. When employing this operation principle, a simple matrix ferroelectric memory can perform a memory operation with no disturbance. When applying the aforementioned pulses, the width of the pulses applied to the word line WL2 in writing and reading may be set to not more than 70 ns in the timing chart shown in FIG. 3, for example.

While the ferroelectric layer(s) is entirely formed between the word lines WL and the bit lines BL in each of the aforementioned third to tenth embodiments, the present invention is not restricted to this but the ferroelectric layer(s) (data storage parts) necessary for operations of the ferroelectric memory may simply be formed at least on the intersections between the word lines WL and the bit lines BL.

In each of the aforementioned third to tenth embodiments, further, ferroelectric layers or insulator layers may be arranged on regions between the adjacent word lines WL and between the adjacent bit lines BL.

What is claimed is:

1. A memory device comprising:
   a pair of bit lines extending in a prescribed direction;
   a word line arranged to intersect with said pair of bit lines; and
   a memory cell, arranged between said pair of bit lines and said word line, consisting of two capacitance means.

2. The memory device according to claim 1, wherein said two capacitance means include a ferroelectric layer.

3. The memory device according to claim 1, wherein said two capacitance means store complementary data respectively, thereby storing one-bit data in said memory cell.

4. The memory device according to claim 3, applying a pulsing voltage to said word line while applying complementary voltages to selected said pair of bit lines when writing said one-bit data.

5. The memory device according to claim 4, further comprising a pulse voltage application circuit for applying said pulsing voltage to said word line at least when writing said one-bit data.

6. The memory device according to claim 4, further comprising a write voltage application circuit for applying said complementary voltages to said pair of bit lines when writing said one-bit data.

7. The memory device according to claim 4, further comprising a plurality of memory cells, wherein a prescribed voltage is applied to a selected one of said memory cells while a voltage substantially half said prescribed voltage is applied to a non-selected one of said memory cells when writing and reading said one-bit data.

8. The memory device according to claim 4, reading said one-bit data by detecting a difference between the potentials of said pair of bit lines corresponding to said complementary data stored in said two capacitance means respectively.

9. The memory device according to claim 8, detecting said difference between the potentials of said pair of bit lines corresponding to said complementary data stored in said two capacitance means respectively by precharging said pair of bit lines connected with said selected one of said memory cells to a prescribed voltage and thereafter applying said pulsing voltage to said word line connected with said selected one of said memory cells when reading said one-bit data.

10. The memory device according to claim 8, further comprising a read amplifier for amplifying said difference between the potentials of said pair of bit lines corresponding to said complementary data stored in said two capacitance means respectively.

11. The memory device according to claim 1, further comprising a plurality of memory cells, wherein a prescribed voltage is applied to a selected one of said memory cells while a voltage of substantially one third of said prescribed voltage is applied to a non-selected one of said memory cells when writing and reading one-bit data.

12. The memory device according to claim 11, applying said prescribed voltage to said selected one of said memory cells connected with a first bit line of said pair of bit lines while applying said voltage of substantially one third of said prescribed voltage to said non-selected one of said memory cells and said selected one of said memory cells connected with a second bit line of said pair of bit lines thereby writing prescribed data in said selected one of said memory cells connected with the first bit line of said pair of bit lines and thereafter applying said prescribed voltage to said selected memory cells connected with the second bit line of said pair of bit lines while applying said voltage of substantially one third of said prescribed voltage to said non-selected one of said memory cells and said selected one of said memory cells connected with the first bit line of said pair of bit lines thereby writing data inverse to said prescribed data in said selected one of said memory cells connected with the second bit line of said pair of bit lines when writing said one-bit data.

13. The memory device according to claim 11, detecting said difference between the potentials of said pair of bit lines corresponding to said complementary data stored in said two capacitance means respectively by precharging said pair of bit lines connected with said selected one of said memory cells to a first prescribed voltage and thereafter applying a second prescribed voltage to said word line connected with said selected one of said memory cells when reading said one-bit data.

14. The memory device according to claim 1, further comprising a plurality of memory cells, wherein a high voltage having a prescribed pulse width causes polarization inversion when applied to said capacitance means, and wherein a low voltage having said prescribed pulse width causes substantially no polarization inversion when applied to said capacitance means, further wherein
   the high voltage having said prescribed pulse width is applied to a selected one of said memory cells while the low voltage having said prescribed pulse width is applied to a non-selected one of said memory cells at least either in data writing or in data reading.

15. The memory device according to claim 14, wherein said prescribed pulse width is not more than 70 ns.

16. The memory device according to claim 1, further comprising a plurality of bit lines and a plurality of word lines, wherein
   either said plurality of bit lines or said plurality of word lines have a multilevel structure, and
   said two capacitance means have multilevel structures.

17. The memory device according to claim 16, wherein
   said two capacitance means forming each said memory cell include a first data storage part and a second data storage part for storing complementary data respectively, and
   said first data storage part and said second data storage part are transversely arranged at a prescribed interval.

18. The memory device according to claim 16, wherein
   said two capacitance means forming said memory cell include a first data storage part and a second data storage part for storing complementary data respectively, and said first data storage part and said second data storage part are vertically arranged at a prescribed interval.

19. The memory device according to claim 16, wherein said two capacitance means forming said memory cell include a first data storage part and a second data storage part for storing complementary data respectively, and said first data storage part and said second data storage part are obliquely arranged at a prescribed interval.

20. The memory device according to claim 16, wherein said plurality of bit lines are arranged above and under said plurality of word lines respectively, and said two capacitance means include:

a first data storage layer arranged between a first bit line of said pair of bit lines and said word line, wherein the first bit line is located above said word line; and a second data storage layer arranged between a second line of said pair of bit lines and said word line wherein the second bit line is located under said word line.

21. The memory device according to claim 16, wherein said plurality of bit lines include at least a first-level bit line and a second-level bit line, said plurality of word lines includes at least a first-level word line and second-level word line, and said two capacitance means include:

a first data storage layer arranged between said first-level bit line and said first-level word line, and a second data storage layer arranged between said second-level bit line and said second-level word line, said memory device further comprising an insulator layer formed between a first region formed with said first data storage layer, said first-level word line and said first-level bit line and a second region formed with said second data storage layer, said second-level word line and said second-level bit line for isolating said first region and said second region from each other.

22. The memory device according to claim 16, wherein said plurality of bit lines include at least a first-level bit line, a second-level bit line and a third-level bit line, said plurality of word line includes at least a first-level word line and a second-level word line, and said two capacitance means include:

a first data storage layer arranged between said first-level bit line and said first-level word line, a second data storage layer arranged between said first-level word line and said second-level bit line, a third data storage layer arranged between said second-level bit line and said second-level word line, and a fourth data storage layer arranged between said second-level word line and said third-level bit line.

* * * * *